United States Patent
Numata et al.

(10) Patent No.: US 11,914,180 B2
(45) Date of Patent: Feb. 27, 2024

(54) OPTICAL FILTER, METHOD OF PRODUCING SAME, AND OPTICAL MODULE

(71) Applicant: NITTO DENKO CORPORATION, Osaka (JP)

(72) Inventors: Yudai Numata, Osaka (JP); Masato Katsuda, Osaka (JP); Shoichi Matsuda, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/911,875

(22) PCT Filed: Mar. 15, 2021

(86) PCT No.: PCT/JP2021/010416
§ 371 (c)(1),
(2) Date: Sep. 15, 2022

(87) PCT Pub. No.: WO2021/187433
PCT Pub. Date: Sep. 23, 2021

(65) Prior Publication Data
US 2023/0116255 A1    Apr. 13, 2023

(30) Foreign Application Priority Data

Mar. 16, 2020 (JP) ................................. 2020-045671
Sep. 29, 2020 (JP) ................................. 2020-163409
Nov. 16, 2020 (JP) ................................. 2020-190208

(51) Int. Cl.
*G02B 5/08*    (2006.01)
*G02B 5/02*    (2006.01)
(Continued)

(52) U.S. Cl.
CPC .............. *G02B 5/26* (2013.01); *G02B 5/0242* (2013.01); *G02B 5/0284* (2013.01); *G02B 5/208* (2013.01)

(58) Field of Classification Search
CPC ... G02B 1/00; G02B 1/10; G02B 1/11; G02B 1/111; G02B 1/113; G02B 1/115;
(Continued)

(56) References Cited

U.S. PATENT DOCUMENTS

2008/0316594 A1    12/2008    Hashiguchi et al.
2015/0043058 A1    2/2015    Saito
(Continued)

FOREIGN PATENT DOCUMENTS

CN    104081231    10/2014
CN    110873914    3/2020
(Continued)

OTHER PUBLICATIONS

M. Iwata et al., "Bio-Inspired Bright Structurally Coloured Colloidal Amorphous Array Enhanced by Controlling Thickness and Black Background", Advanced Materials, pp. 1-17, 2017.
(Continued)

*Primary Examiner* — Thong Q Nguyen
(74) *Attorney, Agent, or Firm* — GREENBLUM & BERNSTEIN, P.L.C.

(57) ABSTRACT

An optical filter has a back-scattering property. The linear transmittance thereof to light of at least some avelengths in the wavelength range of 760-2000 nm is 60% or higher. The azimuth is 20° from an incidence plane when the polar angle of the direction of incidence of incident light is 0°. The value of a bidirectional reflectance distribution function in the direction 'here the polar angle is −60' is BRDF (0°; 20°, −60°). The azimuth is 20° from an incidence plane when the polar angle of the direction of incidence of incident light is
(Continued)

30°. The value of a bidirectional reflectance distribution function in the direction where the polar angle is −60° is BRDF (30°; 20°, −60°). The azimuth is 20° from an incidence plane when the polar angle of the direction of incidence of incident light is 60°.

20 Claims, 27 Drawing Sheets

(51) Int. Cl.
  *G02B 5/20* (2006.01)
  *G02B 5/26* (2006.01)
  *G02B 5/28* (2006.01)

(58) Field of Classification Search
  CPC . G02B 5/00; G02B 5/003; G02B 5/02; G02B 5/0205; G02B 5/0236; G02B 5/0242; G02B 5/0278; G02B 5/0284; G02B 5/0289; G02B 5/0294; G02B 5/20; G02B 5/201; G02B 5/206; G02B 5/208; G02B 5/22; G02B 5/26; G02B 5/28; G02B 5/281; G02B 5/285; G02B 5/286; G02B 5/287
  USPC .................. 359/350–361, 557–599, 885–892
  See application file for complete search history.

(56) References Cited

U.S. PATENT DOCUMENTS

| 2017/0081535 | A1 | 3/2017 | Kohri et al. |
| 2019/0302083 | A1* | 10/2019 | Lalovic ................. G01J 3/0224 |
| 2019/0391307 | A1 | 12/2019 | Wheatley et al. |
| 2019/0391311 | A1 | 12/2019 | Nevitt et al. |
| 2022/0099867 | A1* | 3/2022 | Shigitani .................. F21V 9/20 |
| 2023/0117522 | A1* | 4/2023 | Numata ................. G02B 5/208 359/350 |
| 2023/0119681 | A1* | 4/2023 | Katsuda ................. G02B 5/223 359/350 |

FOREIGN PATENT DOCUMENTS

| JP | 2006-165493 | | 6/2006 |
| JP | 2008-160115 | | 7/2008 |
| JP | 2010-58091 | | 3/2010 |
| JP | 2013-65052 | | 4/2013 |
| JP | 2017-62271 | | 3/2017 |
| RU | 2380757 | * | 1/2010 |
| TW | 201506463 | | 2/2015 |
| WO | 2018/160866 | | 9/2018 |

OTHER PUBLICATIONS

May 18, 2021 International Search Report issued in corresponding International Patent Application No. PCT/JP2021/010416, along with an English translation thereof.
Dec. 14, 2021 Notice of Reasons for Refusal in corresponding Japanese Application No. 2021-565063 and translation thereof.
May 18, 2021 Written Opinion of the International Searching Authority in corresponding PCT/JP2021/010416 and translation thereof.
Sep. 27, 2023 Extended European Search Report issued in corresponding European Application No. 21770792.6.

* cited by examiner

1μm

2μm

500nm

OPTICAL FILTER, METHOD OF PRODUCING SAME, AND OPTICAL MODULE

TECHNICAL FIELD

The present invention relates to an optical filter, a method for producing the same, and an optical module; for example, an optical filter preferably usable as an infrared filter having a high infrared regular transmittance and a high visible light diffuse reflectance, a method for producing the same, and an optical module including a device and such an optical filter provided at a front surface of an infrared receiver of the device, the device being, for example, a sensing device or a communication device.

BACKGROUND ART

Senser technologies and communication technologies using infrared rays have been developed and put into practice. Elements that receive infrared rays are generally sensitive also to visible light. Therefore, an infrared-transmissive filter that selectively transmits only infrared rays is used. The definition of the "infrared rays" varies in accordance with the technological art. In this specification, the term "infrared rays" refers to light that includes at least light (electromagnetic waves) having a wavelength in the range not shorter than 760 nm and not longer than 2000 nm and that is used for sensing or communication. The "visible light" refers to light having a wavelength in the range not shorter than 400 nm and shorter than 760 nm.

Conventional mainstream infrared-transmissive filters exhibit a black color to absorb visible light, and therefore, have a problem of being poor in terms of design quality.

Patent Document 1 discloses an infrared receiver/transmitter including a dielectric multi-layer film transmitting infrared rays and reflecting and transmitting visible light and having a matte-finished surface. Patent Document 2 discloses an optical item for infrared communication that exhibits a white color and has an infrared transmittance of 12% or higher. In order to allow the optical item to exhibit a white color, a surface of a transparent substrate is roughened to form a microscopic concaved and convexed pattern, and visible light is scattered by Rayleigh scattering provided by the microscopic concaved and convexed pattern.

CITATION LIST

Patent Literature

Patent Document 1: Japanese Laid-Open Patent Publication No. 2006-165493 (Japanese Patent No. 4122010)
Patent Document 2: Japanese Laid-Open Patent Publication No. 2013-65052 (Japanese Patent No. 5756962)
Patent Document 3: Japanese Laid-Open Patent Publication No. 2010-058091 (Japanese Patent No. 5274164)

Non-Patent Literature

Non-patent literature 1: M. Iwata et al., "Bio-Inspired Bright Structurally Colored Colloidal Amorphous Array Enhanced by Controlling Thickness and Black Background", Adv. Meter., 2017, 29, 1605050

The infrared receiver/transmitter described in Patent Document 1 colors an external surface thereof only with the visible light reflected by the dielectric multi-layer film. Therefore, the color varies in accordance with the angle at which the infrared receiver/transmitter is viewed. There is also a problem that the dielectric multi-layer film is costly.

According to studies made by the present inventors, the following has been found out regarding a film for infrared communication using such a dielectric multi-layer film as described in Patent Document 1. In the case where a motion of a hand is captured by an infrared camera through such a film, the contour of the hand is blurred, and thus it is difficult to use the film for motion capturing. A conceivable reason for this is that the film has a low infrared regular transmittance.

For example, Patent Document 3 and Non-patent Literature each disclose that a fine-particle dispersion having an amorphous structure or a colloidal amorphous array expresses a bright structural color (e.g., blue) with small angle dependence. Patent Document 3 describes that a fine-particle dispersion having an amorphous structure is especially useful for a use in which light of a specific wavelength is reflected (e.g., for a color material, an infrared-reflective film, etc.).

SUMMARY OF THE INVENTION

The present invention made to solve the above-described problems has an object of providing an optical filter that is usable as an infrared-transmissive filter having a high infrared regular transmittance and has isotropic back-scattering characteristics, a method for producing the same, and an optical module.

Embodiments of the present invention provide the following solution to the problem.

[Item 1]

An optical filter having back-scattering characteristics, wherein the optical filter has a regular transmittance of 60% of higher for light having a wavelength in at least a part of a wavelength range not shorter than 760 nm and not longer 2000 nm, and wherein with setting that:
in the case where incident light has a polar angle of 0° in a direction of incidence, a bidirectional reflectance distribution function value in a direction having an azimuth of 20° from a plane of incidence and having a polar angle of −60° is BRDF (0°; 20°, −60°),
in the case where the incident light has a polar angle of 30° in the direction of incidence, the bidirectional reflectance distribution function value in the direction having an azimuth of 20° from the plane of incidence and having a polar angle of −60° is BRDF (30°; 20°, −60°), and
in the case where the incident light has a polar angle of 60° in the direction of incidence, the bidirectional reflectance distribution function value in the direction having an azimuth of 20° from the plane of incidence and having a polar angle of −60° is BRDF (60°; 20°, −60°),
in the case where the incident light has a wavelength in at least a part of a visible light wavelength range, |BRDF (0°; 20°, −60°)−BRDF (30°; 20°, −60°)|/BRDF (0°; 20°, −60°) is 1.0 or smaller, and |BRDF (0°; 20°, −60°)−BRDF (60°; 20°, −60°)|/BRDF (0°; 20°, −60°) is 1.0 or smaller.

[Item 2]

The optical filter of item 1, wherein |BRDF (0°; 20°, −60°)−BRDF (30°; 20°, −60°)|/BRDF (0°; 20°, −60°) is 0.50 or smaller, and |BRDF (0°; 20°, −60°)−BRDF (60°; 20°, −60°)|/BRDF (0°; 20°, −60°) is 0.50 or smaller.

[Item 3]

The optical filter of item 1, wherein |BRDF (0°; 20°, 60°)−BRDF (30°; 20°, −60°)|/BRDF (0°; 20°, −60°) is 0.25 or smaller, and |BRDF (0°; 20°, −60°)−BRDF (60°; 20°, −60°)|/BRDF (0°; 20°, −60°) is 0.25 or smaller.

[Item 4]

The optical filter of any one of items 1 through 3, wherein the optical filter has a value of L* measured by an SCE method of 20 or larger.

[Item 5]

The optical filter of any one of items 1 through 4, wherein the optical filter has a three-dimensional shape.

[Item 6]

The optical filter of any one of items 1 through 5, wherein the three-dimensional shape includes at least a part of a geometrically solid shape.

[Item 7]

The optical filter of item 6, wherein the geometrically solid shape comprises either one of a spherical shape, an ellipsoidal shape, a polyhedral shape, a conical shape and a cylindrical shape.

[Item 8]

The optical filter of any one of items 1 through 7, wherein the optical filter includes a substrate and a film formed on the substrate, wherein the regular transmittance of the film for light having a wavelength in at least a part of the wavelength range not shorter than 760 nm and not longer 2000 nm is 60% or higher, and wherein with settings that:

in the case where the incident light has a polar angle of 0° in the direction of incidence, the bidirectional reflectance distribution function value in the direction having an azimuth of 20° from the plane of incidence and having a polar angle of −60° is BRDF (0°; 20°, −60°), in the case where the incident light has a polar angle of 30° in the direction of incidence, the bidirectional reflectance distribution function value in the direction having an azimuth of 20° from the plane of incidence and having a polar angle of −60° is BRDF (30°; 20°, −60°), and in the case where the incident light has a polar angle of 60° in the direction of incidence, the bidirectional reflectance distribution function value in the direction having an azimuth of 20° from the plane of incidence and having a polar angle of −60° is BRDF (60°; 20°, −60°), in the case where the incident light has a wavelength in at least a part of the visible light wavelength range, |BRDF (0°; 20°, −60°)−BRDF (30°; 20°, −60°)|/BRDF (0°; 20°, −60°) is 1.0 or smaller, and |BRDF (0°; 20°, −60°)−BRDF (60°; 20°, −60°)|/BRDF (0°; 20°, −60°) is 1.0 or smaller.

[Item 9]

The optical filter of item 8, wherein the substrate is formed of a plastic material or glass.

[Item 10]

The optical filter of item 8 or 9, wherein the substrate is obtained as a result of either one of corona treatment, plasma treatment, UV ozone treatment and primer treatment.

[Item 11]

The optical filter of any one of items 1 through 10, wherein the regular transmittance for light having a wavelength of 950 nm is 60% or higher.

[Item 12]

The optical filter of any one of items 1 through 11, wherein the regular transmittance for light having a wavelength of 1550 nm is 60% or higher.

[Item 13]

The optical filter of any one of items 1 through 12, wherein a color exhibited in the case where standard light from a D65 light source is used has x and y coordinates in ranges of 0.25≤x≤0.40 and 0.25≤y≤0.40 on a CIE 1931 chromaticity diagram.

[Item 14]

The optical filter of any one of items 1 through 13, wherein a transmittance curve of the filter in a visible light wavelength region includes a curved portion where the regular transmittance is decreased monotonously from a longer wavelength side to a shorter wavelength side, and the curved portion is shifted to the longer wavelength side as an angle of incidence is increased.

[Item 15]

The optical filter of any one of items 1 through 14, wherein the regular transmittance for light having a wavelength of 950 nm when an angle of incidence is 60° is 80% or higher of the regular transmittance when the angle of incidence is 0°.

[Item 16]

The optical filter of any one of items 1 through 15, further comprising a printed layer formed of infrared-transmissive ink.

[Item 17]

The optical filter of any one of items 1 through 16, wherein the optical filter comprises a matrix and fine particles dispersed in the matrix.

[Item 18]

The optical filter of item 17, wherein the fine particles include mono-dispersed first fine particles having an average particle diameter in a range not shorter than 80 nm and not longer than 300 nm.

[Item 19]

The optical filter of item 18, wherein the first fine particles have an average particle diameter of 150 nm or longer.

[Item 20]

The optical filter of any one of items 17 through 19, wherein the fine particles have an average value of inter-gravitational center distances of 200 nm or longer on a cross-section vertical to a planar direction of the filter.

[Item 21]

The optical filter of any one of items 17 through 20, wherein the fine particles have a coefficient of variation, of an average value of inter-gravitational center distances on a cross-section vertical to a planar direction of the filter, of 10% or higher.

[Item 22]

The optical filter of any one of items 17 through 21, wherein the fine particles have a coefficient of variation, of an average value of inter-gravitational center distances on a cross-section vertical to a planar direction of the filter, of 45% or lower.

[Item 23]

The optical filter of any one of items 17 through 22, wherein the matrix contains a resin having a crosslinked structure.

[Item 24]

The optical filter of any one of items 17 through 23, wherein the fine particles form at least a colloidal amorphous array.

[Item 25]

The optical filter of any one of items 17 through 24, wherein the fine particles has a volume fraction not lower than 6% and not higher than 60%.

[Item 26]

The optical filter of any one of items 17 through 25, wherein where the matrix has a refractive index of nm and the fine particles have a refractive index of $n_P$, both for light having a wavelength of 546 nm, $|n_M-n_P|$ is not smaller than 0.03 and not larger than 0.6.

[Item 27]

The optical filter of any one of items 17 through 26, wherein the matrix is formed of a resin, and the fine particles are formed of an inorganic material.

[Item 28]

A method for producing the optical filter of item 27, the method comprising the steps of:

preparing a curable resin composition containing the fine particles dispersed and mixed in a curable resin;

providing a surface of a substrate with the curable resin composition, and curing the curable resin contained in the curable resin composition provided on the surface.

[Item 29]

The method of item 28, wherein the step of providing is performed by a coating method.

[Item 30]

The method of item 29, wherein the step of providing is performed by a dip coating method.

[Item 31]

An optical module, comprising:

a device including an infrared receiver; and the optical filter of any one of items 1 through 27 located on a front surface of the infrared receiver of the device.

[Item 32]

The optical module of item 31, wherein the device is a sensing device, a communication device, a solar cell, a heater or a power supply device.

Advantageous Effects of Invention

Embodiments of the present invention provide an optical filter that is usable as an infrared-transmissive filter having a high infrared regular transmittance and has isotropic back-scattering characteristics, a method for producing the same, and an optical module.

DESCRIPTION OF EMBODIMENTS

Figure 1:
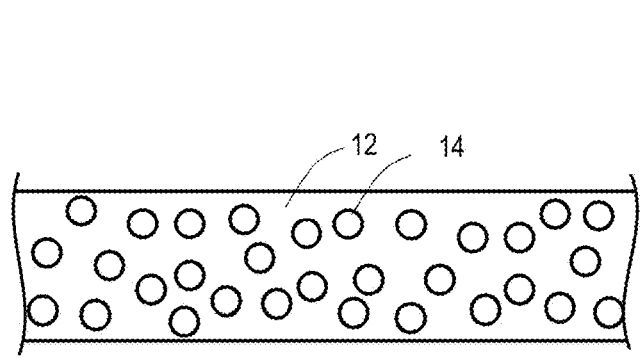
FIG. 1 is a schematic cross-sectional view of an optical filter 10 according to an embodiment of the present invention.

Hereinafter, an optical filter according to an embodiment of the present invention will be described with reference to the drawings. An optical filter according to an embodiment of the present invention is not limited to any of those described in the following examples.

An optical filter according to an embodiment of the present invention includes a matrix and fine particles dispersed in the matrix. The fine particles form at least a colloidal amorphous array, and have a regular transmittance of 60% or higher for light having a wavelength in at least a part of a wavelength range not shorter than 950 nm and not longer than 2000 nm. For example, an optical filter having a regular transmittance of 60% or higher for light having a wavelength not shorter than 950 nm and not longer than 1550 nm is obtained. The wavelength range of the light for which the optical filter has a regular transmittance of 60% or higher (wavelength range of near infrared light) is preferably, for example, not shorter than 810 nm and not longer than 1700 nm, and more preferably, not shorter than 840 nm and not longer than 1650 nm. Such an optical filter is preferably usable for, for example, an InGaAs sensor, an InGaAs/GaAsSb sensor, a CMOS sensor, an NMOS sensor, and a CCD sensor. It is preferred that the matrix and the fine particles are both transparent to the visible light (hereinafter, referred to simply as "transparent"). An optical filter according to an embodiment of the present invention may exhibit a white color.

An optical filter according to an embodiment of the present invention includes a colloidal amorphous array. The "colloidal amorphous array" is an array of colloidal particles (particle diameter: 1 nm to 1 μm) that neither have a long-distance order nor cause Bragg reflection. This sharply contrasts to the colloidal particles being distributed so as to have a long-distance order, in which case a so-called colloidal crystal (a type of photonic crystal) is formed and Bragg reflection is caused. Namely, the fine particles (colloidal particles) included in such an optical filter according to an embodiment of the present invention do not form diffraction grating.

The fine particles included in an optical filter according to an embodiment of the present invention include mono-dispersed fine particles having an average particle diameter that is at least $1/10$ of the wavelength of the infrared rays. Namely, for the infrared rays having a wavelength in the range not shorter than 760 nm and not longer than 2000 nm, the average particle diameter of the fine particles is preferably at least 80 nm, more preferably at least 150 nm, and still more preferably at least 200 nm. The upper limit of the average particle diameter of the fine particles is, for example, 300 nm. The fine particles may include two or more types of mono-dispersed fine particles having different average diameters. It is preferred that each of the fine particles is generally spherical. In this specification, the term "fine particles" (plural) is also used in the sense of an array of the fine particles. The term "mono-dispersed fine particles" refers to those having a coefficient of variation (a percentage value of standard deviation/average particle diameter) of 20% or lower, preferably 10% or lower, and more preferably 1 to 5%. An optical filter according to an embodiment of the present invention uses particles having a particle diameter (diameter of the particle, volume-equivalent diameter) that is at least $1/10$ of the wavelength of the infrared rays, and thus has an improved infrared regular transmittance. The principle of the optical filter according to an embodiment of the present invention is different from that of the optical item of Patent Document 2, which utilizes Rayleigh scattering.

Herein, the average particle diameter was found based on a three-dimensional SEM image. Specifically, Helios G4 UX produced by FEI Company was used as a focused ion beam scanning electron microscope (hereinafter, referred to as the "FIB-SEM") to acquire continuous cross-sectional SEM images, the positions the continuous images were corrected, and then a three-dimensional image was re-structured. This will be described in more detail. The acquisition of the cross-sectional reflected electron images by the SEM and FIB (acceleration voltage: 30 kV) processing were repeated 100 times at an interval of 50 nm to re-structure the three-dimensional image. The obtained three-dimensional image was binarized by use of the Segmention function of analysis software (AVISO of Thermo Fisher Scientific Inc.), and an image of the fine particles was extracted. Next, the Separate object operation was performed in order to identify each of the fine particles, and the volume of each fine particle was calculated. Assuming that each particle was spherical, the volume-equivalent diameter was calculated. A value obtained by averaging the particle diameters of the fine particles was set as the average particle diameter.

In order to allow an optical filter according to an embodiment of the present invention to have a regular transmittance of 60% or higher for light having a wavelength in at least a part of the wavelength range not shorter than 760 nm and not longer than 2000 nm, one of the following is adjusted: the refractive indices of the fine particles and the matrix, the average particle diameter of the fine particles, the volume fraction, the distribution (degree of aperiodicity), and the thickness.

An optical filter according to an embodiment of the present invention may exhibit a white color. Herein, the "white color" refers to a color having x and y coordinates in ranges of 0.25×0.40 and 0.25≤y≤0.40 on the CIE 1931 chromaticity diagram, wherein the CIE 1931 chromaticity diagram is the chromaticity diagram promulgated by the International Commission on Illumination as CIE 2019, CIE 1931 chromaticity coordinates of spectrum loci, 2 degree observer (data table), International Commission on Illumination (CIE), Vienna, Austria DOI: 10.25039/CIE.D-S.mifmy4×4, with the standard light being from a D65 light source, which is a light source emitting light according to the standard of the International Commission on Illumination identified as CIE 2022, CIE standard illuminant D65, International Commission on Illumination (CIE), Vienna, Austria, DOI: 10.25039/CIE.DS.hjfimt59. Needless to say, a color closer to x=0.333 and y=0.333 has a higher degree of whiteness. The x and y coordinates are preferably 0.28≤x≤0.37 and 0.28≤y≤0.37, and more preferably 0.30≤x≤0.35 and 0.30≤y≤0.35. The value of SCE* measured by the SCE method on the CIE 1976 color space is preferably 20 or larger, more preferably 40 or larger, still more preferably 50 or larger, and especially preferably 60 or larger. A color having a value of L* of 20 or larger may generally be considered to be white. The upper limit of the value of L* is, for example, 100. The method for measuring the regular transmittance will be described below regarding the experiment examples (including examples and comparative examples).

Figure 50:
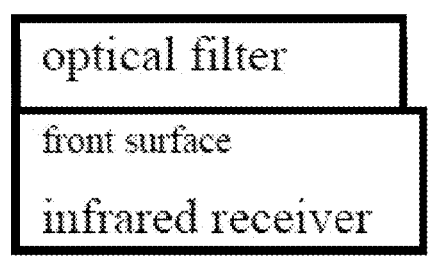
FIG. 50 is a schematic block diagram of an infrared receiver, and an optical filter located on a front surface of the infrared receiver.

FIG. 1 is a schematic cross-sectional view of an optical filter 10 according to an embodiment of the present invention. The optical filter 10 according to an embodiment of the present invention includes a matrix 12 transparent to visible light and transparent fine particles 14 dispersed in the matrix 12. The fine particles 14 form at least a colloidal amorphous array. The optical filter 10 may include other particles that do not disturb the colloidal amorphous array formed by the fine particles 14. In one embodiment, the optical filter is located on a front surface of an infrared receiver, as shown in FIG. 50.

As schematically shown in FIG. 1, the optical filter 10 has a substantially flat surface. Herein, the expression "substantially flat surface" refers to a surface that does not have a concaved and convexed structure of such a size as to scatter (diffract) or diffuse-reflect visible light or infrared rays. The optical filter 10 does not contain a cholesteric liquid crystal material (encompassing a polymeric liquid crystal material, a low-molecular weight liquid crystal material, a mixture thereof, and such a liquid crystal material mixed with a crosslinker to be, for example, crosslinked and thus solidified; widely encompassing a liquid crystal material having a cholesteric phase). The optical filter 10 is, for example, film-like, but is not limited to this.

The transparent fine particles 14 are, for example, silica fine particles. Usable as the silica fine particles are silica fine particles synthesized by, for example, a Stober method. As the fine particles, inorganic fine particles other than silica fine particles may be used. Resinous fine particles may be used. The resinous fine particles are preferably fine particles formed of at least one of, for example, polystyrene and poly(methyl methacrylate), and more preferably fine particles formed of crosslinked polystyrene, crosslinked poly (methyl methacrylate) or crosslinked styrene-methyl methacrylate copolymer. As such fine particles, for example, polystyrene fine particles or poly(methyl methacrylate) fine particles synthesized by emulsion polymerization may be used when appropriate. Alternatively, air-containing hollow silica fine particles or hollow resinous fine particles may be used. Fine particles formed of an inorganic material are advantageous in being highly resistant against heat and light. The fine particles have a volume fraction that is preferably not lower than 6% and not higher than 60%, more preferably not lower than 20% and not higher than 50%, and still more preferably not lower than 20% and not higher than 40% with respect to the entirety of the optical filter (including the matrix and the fine particles). The transparent fine particles 14 may have optical isotropy.

The matrix 12 may be formed of, for example, acrylic resin (e.g., poly(methyl methacrylate), poly(methyl acrylate)), polycarbonate, polyester, poly(diethyleneglycolbisallylcarbonate), polyurethane, epoxy resin, or polyimide, but is not limited to being formed of any of these materials. It is preferred that the matrix 12 is formed of a curable (thermosetting or thermoplastic) resin. From the point of view of mass-productivity, it is preferred that the matrix 12 is formed of a photocurable resin. As the photocurable resin, any of various (meth)acrylates is usable. It is preferred that such a (meth)acrylate contains two-functional or at least three-functional (meth)acrylate. It is preferred that the matrix 12 has optical isotropy. Use of a curable resin containing a polyfunctional monomer allows the matrix 12 to have a crosslinked structure. Therefore, the heat resistance and the light resistance are improved.

The optical filter 10 including the matrix 12 formed of a resin material may be like a flexible film. The optical filter 10 has a thickness that is, for example, not less than 10 μm and not greater than 10 mm. As long as the thickness of the optical filter 10 is, for example, not less than 10 μm and not greater than 1 mm, or further, not less than 10 μm and not greater than 500 μm, the flexibility thereof is conspicuously expressed.

In the case where silica fine particles having a hydrophilic surface are used as the fine particles, it is preferred that, for example, a hydrophilic monomer is photocured to form such silica fine particles. Examples of the hydrophilic monomer include polyethyleneglycol(meth)acrylate, polyethyleneglycoldi(meth)acrylate, polyethyleneglycoltri(meth)acrylate, polypropyleneglycol(meth)acrylate, polypropyleneglycoldi(meth)acrylate, polypropyleneglycoltri(meth)acrylate, 2-hydroxyethyl(meth)acrylate, 2-hydroxypropyl(meth)acrylate, acrylamide, methylenebisacrylamide, and ethoxylated bisphenol A di(meth)acrylate. The hydrophilic monomer is not limited to any of these materials. One of these monomers may be used independently, or two or more of these monomers may be used in mixture. Needless to say, such two or more monomers may include a monofunctional monomer and a polyfunctional monomer, or may include two or more polyfunctional monomers.

These monomers may be cured when appropriate by use of a photoinitiator. Examples of the photoinitiator include carbonyl compounds such as benzoinether, benzophenone, anthraquinone, thioxane, ketal, acetophenone, and the like; sulfur compounds such as disulfide, dithiocarbamate, and the like; organic peroxides such as benzoyl peroxide, and the like; azo compounds; transfer metal complexes; polysilane compounds; dye sensitizers; etc. Such a photoinitiator is contained at a content that is preferably not lower than 0.05 parts by mass and not higher than 3 parts by mass, and more preferably not lower than 0.05 parts by mass and not higher than 1 part by mass, with respect to 100 parts by mass of the mixture of the fine particles and the monomer.

Where the refractive index of the matrix to the visible light is $n_M$ and the refractive index of the fine particles to the visible light is $n_P$, $|n_M-n_P|$ (hereinafter, may be referred to simply as the "refractive index difference") is preferably not smaller than 0.01 and not larger than 0.6, and more preferably not smaller than 0.03 and not larger than 0.11. If the refractive index difference is smaller than 0.03, the scattering intensity is too weak to easily provide desired optical characteristics. If the refractive index difference is larger than 0.11, the infrared regular transmittance may be decreased. In the case where, for example, zirconia fine particles (refractive index: 2.13) and an acrylic resin are used to realize a refractive index difference of 0.6, the thickness may be decreased to adjust the infrared regular transmittance. As can be seen, the infrared regular transmittance is adjustable by, for example, controlling the thickness of the optical filter and the refractive index difference. For a certain use, the optical filter and a filter absorbing infrared rays may be used in a stacking manner. The refractive index to the visible light may be represented by, for example, the refractive index to light of 546 nm. Herein, the "refractive index" refers to a refractive index to light of 546 nm unless otherwise specified.

An optical filter according to an embodiment of the present invention may be produced by a production method including, for example, a step of preparing a curable resin composition containing fine particles dispersed and mixed in a curable resin, a step of providing a surface of a substrate with the curable resin composition, and a step of curing the curable resin contained in the curable resin composition provided on the surface. The substrate may be, for example, a glass substrate or a resin film formed of, for example, PET (polyethyleneterephthalate), TAC (triacetylcellulose) or PI (polyimide). The substrate is not limited to being formed of any of these materials. The fine particles may be dispersed and mixed in the curable resin by a known dispersion and mixing device such as a homo mixer, a homogenizer (e.g., supersonic homogenizer, high-pressure homogenizer), or the like. The step of providing the surface with the curable resin composition may be performed by any of various known methods such as, for example, a coating method (e.g., dip coating method, spray coating method, die coating method), a printing method and the like.

Hereinafter, specific experiment examples (examples and comparative examples) will be shown to describe features of a structure and optical characteristics of an optical filter according to an embodiment of the present invention. Table 1 shows structures and optical characteristics of optical filters in examples and comparative examples. Various optical filters shown in Table 1 that are different in the type of resin combined with the silica fine particles, presence/absence of a flocculant, and the dispersion and mixing method were produced.

The optical filters in examples 1 through 13 and comparative examples 1 through 3 were each formed as a film by use of the acrylic resin and the silica fine particles shown in Table 1. Used as the silica fine particles were monodispersed silica fine particles synthesized by a Stober method (average particle diameter: 110 nm; CV value of the particle diameters: 4.5%), (average particle diameter: 181 nm; CV value of the particle diameters: 4.7%), (average particle diameter: 221 nm; CV value of the particle diameters: 4.9%) and (average particle diameter: 296 nm; CV value of the particle diameters: 6.1%)). Herein, Hautform Silbol 220 produced by Fuji Chemical Co., Ltd. was used as the silica fine particles. The particle diameter distribution of the silica fine particles was measured by a scanning electron microscope SU3800 (manufactured by Hitachi High-Tech Corporation).

The silica fine particles were mixed and dispersed in each of acrylic monomers A through E at a predetermined content to prepare a curable resin composition. A surface of a substrate was coated with the curable resin composition by use of an applicator such that a film having a desired thickness would be obtained. The curable resin composition was cured to obtain an optical filter. The curable resin composition was cured as follows. Darocule 1173 used as the photoinitiator was incorporated into the acrylic monomer at a content of 0.2 parts by mass with respect to 100 parts by mass of the acrylic monomer, and the curable resin composition was irradiated with a UV lamp and thus cured by photopolymerization. Different types of monomer were used to form resins (polymers) having different refractive indices.

Acrylic monomers A through E will be shown below. Monomers A and E are trifunctional acrylates, monomer B and C are bifunctional acrylates, and monomer D is a monofunctional acrylate.

A: Pentaerythritoltriacrylate
B: Ethoxylated bisphenol A diacrylate (m+n=10)
C: Ethoxylated bisphenol A diacrylate (m+n=3)
D: Methoxypolyethyleneglycol #400 methacrylate
E: Trimethylolpropane EO denatured triacrylate Acrylic monomers B and C are represented by the following chemical formula (formula 1).

[Formula 1]

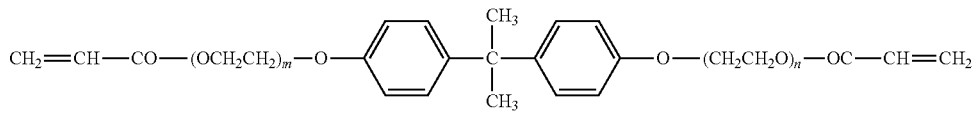

With the thickness of the obtained film being d, the film was cut by a microtome along a plane at a position of d/2 to obtain a sample piece having a thickness same as the average particle diameter of the silica fine particles. In this manner, a sample for an observation with a TEM was obtained. A TEM (HT7820 produced by Hitachi High-Tech Corporation) was used to obtain a cross-sectional TEM image including images of 200 or more particles. Based on the TEM image, the fine particles were subjected to automatic identification Delaunay diagram analysis by use of image processing software Image J to find an average value (La) of inter-gravitational center distances of adjacent fine particles and a standard deviation (Ld). In addition, from the average value of the inter-gravitational center distances (also referred to as the "average inter-gravitational center distance") and the standard deviation, the coefficient of variation (CV value of the distances) was found. Herein, the inter-gravitational center distances were found only regarding the particles having a particle diameter of 150 nm or longer. The particles having a particle diameter shorter than 150 nm were not targeted for finding the inter-gravitational center distances. As described below, these values act as indices that show whether or not the silica fine particles form a colloidal amorphous array, and also show the distribution state of the silica fine particles in the colloidal amorphous array. The lower limit of La is preferably 100 nm, more preferably 150 nm, still more preferably 175 nm, and especially preferably 200 nm. The upper limit of La is preferably 600 nm, and more preferably 500 nm.

increased and the wavelength dependence of the light scattering tends to be decreased. Therefore, for an optical filter according to an embodiment of the present invention, the coefficient of variation of the average inter-gravitational center distance of the fine particles 14 is preferably not lower than 10% and not higher than 45%, more preferably not lower than 15% and not higher than 40%, still more preferably not lower than 20% and not higher than 45%, and furthermore preferably not lower than 25% and not higher than 35%.

TABLE 1

| | AVERAGE PARTICLE DIAMETER [nm] | FRACTION OF SILICA FINE PARTICLES | | MON-OMER | POLYMER REFRACTIVE INDEX | THICK-NESS [μm] | SUB-STRATE | La [nm] | Ld [nm] |
|---|---|---|---|---|---|---|---|---|---|
| | | VOLUME % | MASS % | | | | | | |
| EX. 1 | 221 | 29 | 40 | A | 1.49 | 100 | GLASS | 302 | 84 |
| EX. 2 | 296 | 29 | 40 | A | 1.49 | 100 | GLASS | 440 | 120 |
| EX. 3 | 221 | 34 | 45 | A | 1.49 | 100 | GLASS | — | — |
| EX. 4 | 221 | 38 | 50 | A | 1.49 | 100 | GLASS | — | — |
| EX. s | 221 | 29 | 40 | A | 1.49 | 400 | GLASS | — | — |
| EX. 6 | 221 | 28 | 40 | B | 1.52 | 100 | GLASS | 384 | 95 |
| EX. 7 | 221 | 28 | 40 | B | 1.52 | 100 | PET | — | — |
| EX. 8 | 221 | 28 | 40 | B | 1.52 | 500 | PET | — | — |
| EX. 9 | 221 | 6 | 10 | A | 1.49 | 100 | GLASS | — | — |
| EX. 10 | 221 | 29 | 40 | C | 1.54 | 100 | GLASS | 341 | 99 |
| EX. 11 | 221 | 29 | 40 | D | 1.46 | 100 | GLASS | — | — |
| EX. 12 | 110/221 | 29 | 40 | A | 1.49 | 100 | GLASS | — | — |
| EX. 13 | 181 | 28 | 40 | B | 1.52 | 100 | GLASS | — | — |
| COMPARATIVE EX. 1 | 221 | 29 | 40 | A | 1.49 | 100 | GLASS | 341 | 168 |
| COMPARATIVE EX. 2 | 221 | 29 | 40 | E | 1.48 | 100 | GLASS | 237 | 22 |
| COMPARATIVE EX. 3 | 110 | 29 | 40 | A | 1.49 | 100 | GLASS | 154 | 45 |

| | CV VALUE (Ld/La) | L* (SCE) | COORDINATES ON CIE CHROMATICITY DIAGRAM | | INFRARED REGULAR TRANSMITTANCE [%] | | | BRAGG REFLECTION |
|---|---|---|---|---|---|---|---|---|
| | | | x | y | 760 nm | 950 nm | 1550 nm | |
| EX. 1 | 27.8% | 59 | 0.30 | 0.33 | 75 | 88 | 90 | ABSENT |
| EX. 2 | 27.2% | 70 | 0.30 | 0.31 | 45 | 64 | 89 | ABSENT |
| EX. 3 | — | 60 | 0.31 | 0.32 | 83 | 90 | 90 | ABSENT |
| EX. 4 | — | 68 | 0.30 | 0.33 | 86 | 91 | 90 | ABSENT |
| EX. s | — | 81 | 0.31 | 0.33 | 64 | 85 | 85 | ABSENT |
| EX. 6 | 31.2% | 69 | 0.30 | 0.32 | 79 | 92 | 92 | ABSENT |
| EX. 7 | — | 70 | 0.31 | 0.33 | 79 | 90 | 91 | ABSENT |
| EX. 8 | — | 87 | 0.31 | 0.33 | 50 | 87 | 86 | ABSENT |
| EX. 9 | — | 24 | 0.31 | 0.33 | 73 | 82 | 89 | ABSENT |
| EX. 10 | 29.0% | 73 | 0.30 | 0.33 | 40 | 75 | 89 | ABSENT |
| EX. 11 | — | 13 | 0.28 | 0.29 | 86 | 88 | 86 | ABSENT |
| EX. 12 | — | 55 | 0.26 | 0.29 | 70 | 80 | 85 | ABSENT |
| EX. 13 | — | 63 | 0.28 | 0.32 | 87 | 91 | 92 | ABSENT |
| COMPARATIVE EX. 1 | 49.3% | 72 | 0.30 | 0.32 | 10 | 21 | 45 | ABSENT |
| COMPARATIVE EX. 2 | 9.4% | 49 | 0.33 | 0.31 | 90 | 92 | 92 | PRESENT |
| COMPARATIVE EX. 3 | 29.4% | 20 | 0.22 | 0.19 | 87 | 89 | 89 | ABSENT |

Figure 2:
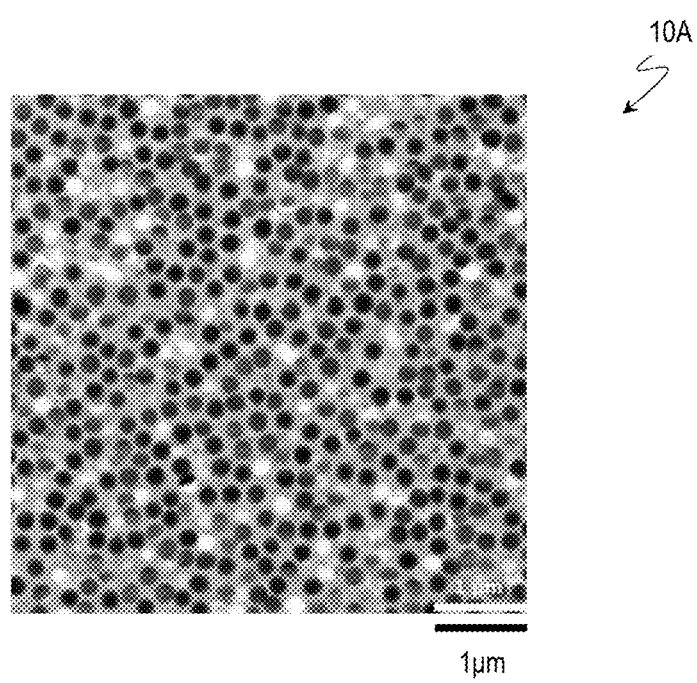
FIG. 2 shows a cross-sectional TEM image of an optical filter 10A in example 1.
Figure 3:
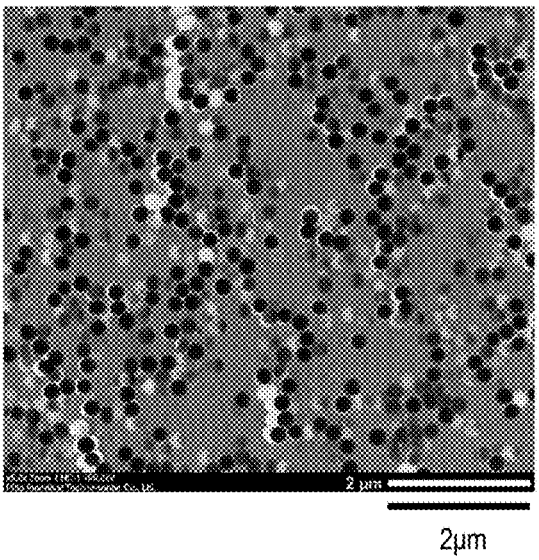
FIG. 3 shows a cross-sectional TEM image of an optical filter 20A in comparative example 1.

The colloidal amorphous array included in an optical filter according to an embodiment of the present invention is characterized by the coefficient of variation of the average inter-gravitational center distance of fine particles 14. A low coefficient of variation indicates that the long-distance order is large, and in this case, a reflective color having angle dependence caused by Bragg reflection is expressed. By contrast, in the case where the coefficient of variation is high, the influence of the Mie scattering tends to be FIG. 2 shows a cross-sectional TEM image of an optical filter 10A in example 1, and FIG. 3 shows a cross-sectional TEM image of an optical filter 20A in comparative example 1. In the TEM image in each of the figures, white circles are silica fine particles and black circles are sites from which the silica fine particles have been dropped. In the image processing, the black circles were also treated as the silica fine particles.

It is seen that at the cross-section of the optical filter 10A shown in FIG. 2, the silica fine particles are dispersed almost uniformly; whereas at the cross-section of the optical filter 20A shown in FIG. 3, the silica fine particles are partially flocculated. A reason for this is that for producing the optical filter 20A in comparative example 1, polyethyleneglycol was incorporated as a flocculant in addition to acrylic monomer A. The flocculant was incorporated at a content of 0.1% by mass with respect to 100% by mass of acrylic monomer A.

Figure 4:
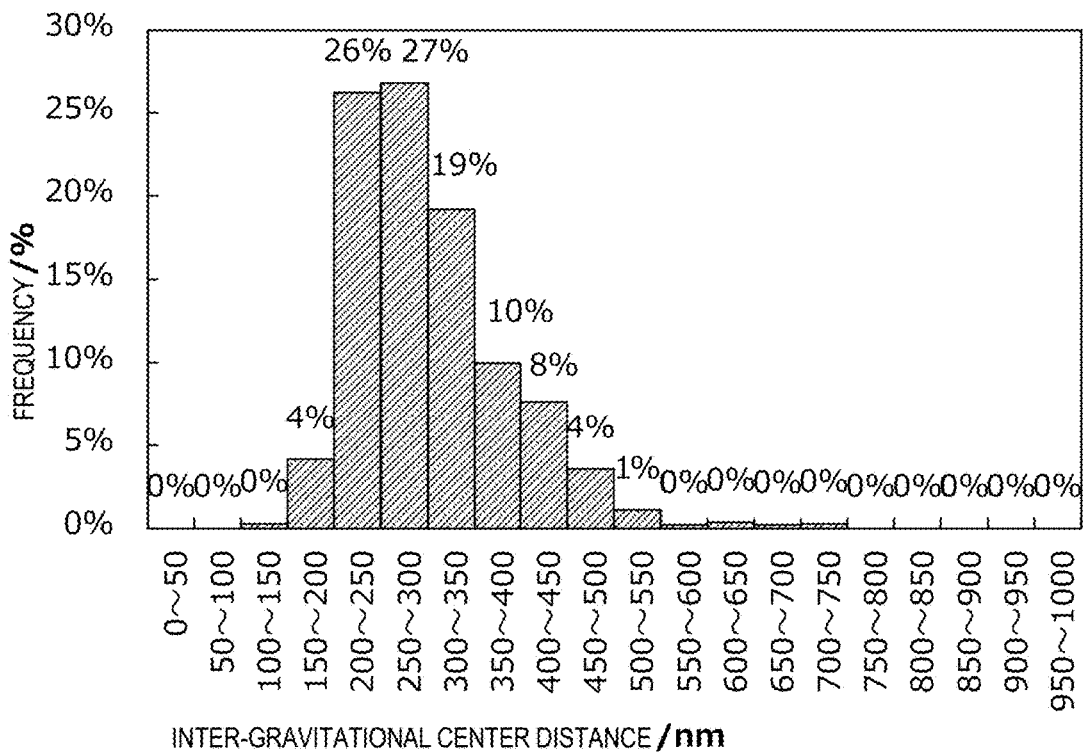
FIG. 4 shows a histogram of inter-gravitational center distances of particles found from the cross-sectional TEM image of the optical filter 10A in example 1.
Figure 5:
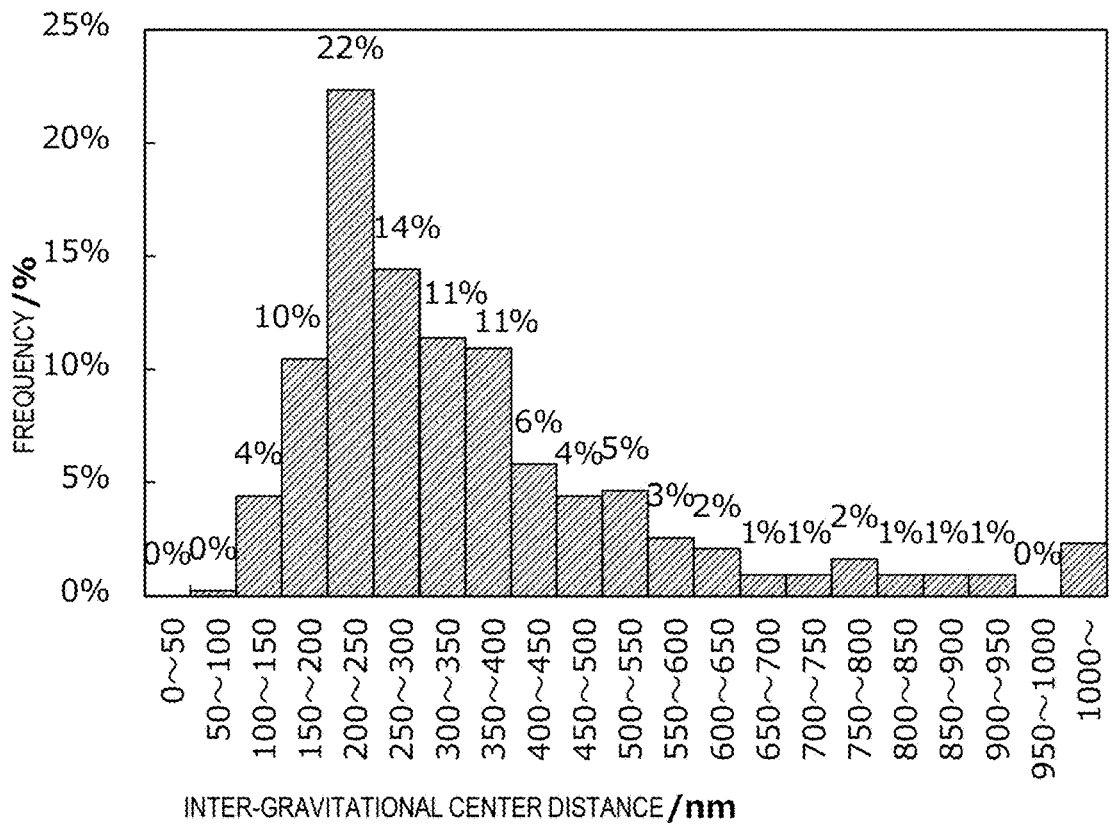
FIG. 5 shows a histogram of inter-gravitational center distances of particles found from the cross-sectional TEM image of the optical filter 20A in comparative example 1.

Now, FIG. 4 shows a histogram of the inter-gravitational center distances of the particles found from the cross-sectional TEM image of the optical filter 10A in example 1. FIG. 5 shows a histogram of the inter-gravitational center distances of the particles found from the cross-sectional TEM image of the optical filter 20A in comparative example 1. Table 1 shows the average inter-gravitational center distance La (nm), the standard deviation Ld (nm), and the coefficient of variation (CV value of the distances) found from these histograms. Hereinafter, the CV value of the distances may be referred to simply as the "CV value".

It is seen that the distribution of the silica fine particles in the optical filter 10A in example 1 is more uniform than the distribution of the silica fine particles in the optical filter 20A in comparative example 1. Regarding the optical filter 10A in example 1, Ld is 84 nm and the CV value is 27.8%, whereas regarding the optical filter 20A in comparative example 1, Ld is as large as 168 nm and the CV value is as high as 49.3%.

Figure 6:
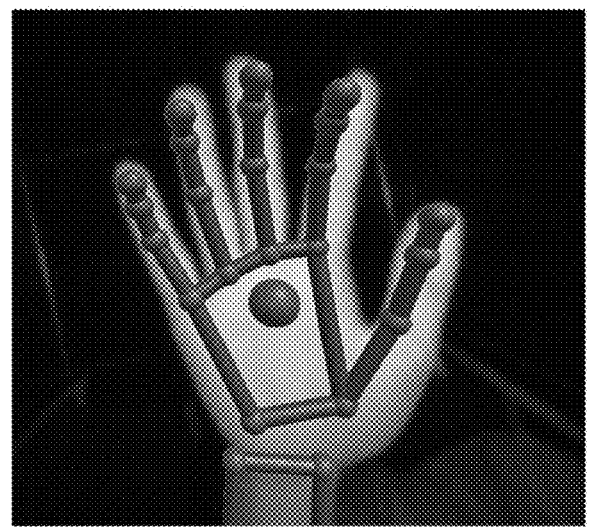
FIG. 6 is an example of camera image acquired by use of a motion capture device.
Figure 7:
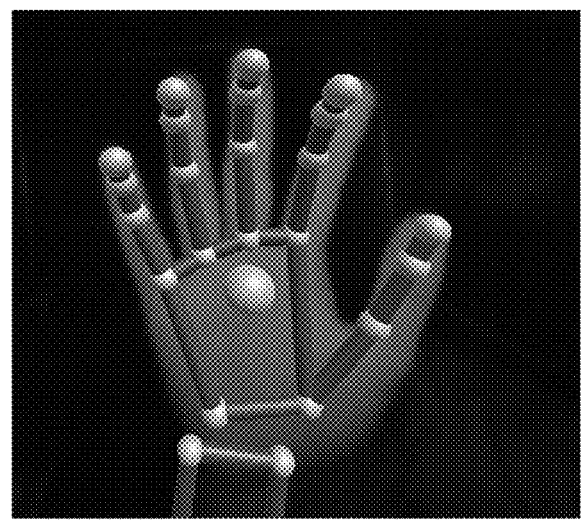
FIG. 7 is an example of camera image acquired by use of the motion capture device through the optical filter 10A in example 1.
Figure 8:
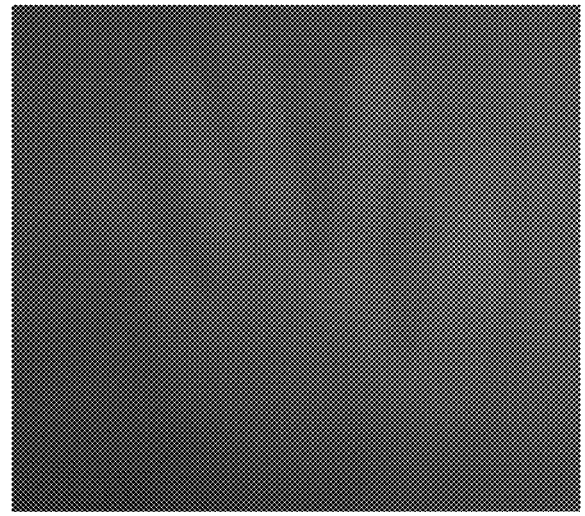
FIG. 8 is an example of camera image acquired by use of the motion capture device through the optical filter 20A in comparative example 1.

Now, with reference to FIG. 6 through FIG. 8, results of a comparison between the optical filter 10A in example 1 and the optical filter 20A in comparative example 1 regarding the performance as an infrared filter will be described. FIG. 6 shows an example of camera image acquired by use of a motion capture device with no use of a filter. FIG. 7 shows an example of camera image acquired by use of the motion capture device through the optical filter 10A in example 1. FIG. 8 shows an example of camera image acquired by use of the motion capture device through the optical filter 20A in comparative example 1.

Herein, Leap Motion Controller (registered trademark) was used as the motion capture device, and a camera image of a hand located about 20 cm away from the motion capture device was acquired. The device uses infrared rays having a wavelength of 850 nm. As clearly seen from a comparison between FIG. 6, FIG. 7 and FIG. 8, the image acquired in the case where the optical filter 10A in example 1 is used (FIG. 7) is approximately as clear as the image acquired in the case where no filter is used (FIG. 6), whereas the image acquired in the case where the optical filter 20A in comparative example 1 is used (FIG. 8) is not clear and does not allow the hand to be recognized.

Figure 9:
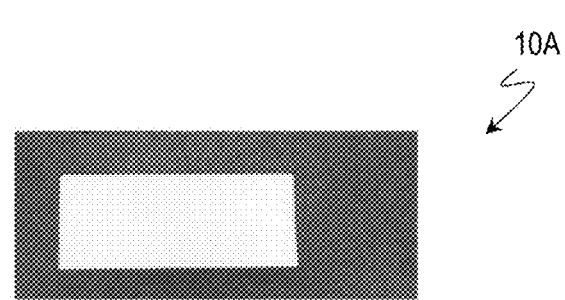
FIG. 9 shows an optical image of the optical filter 10A in example 1.
Figure 10:
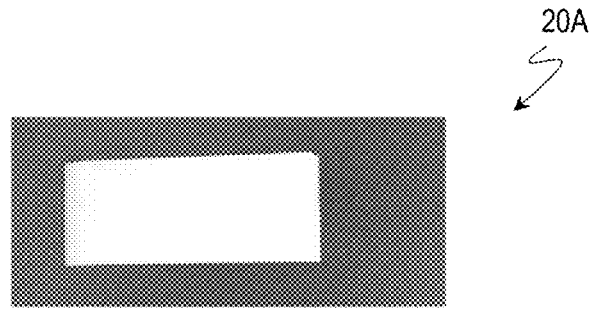
FIG. 10 shows an optical image of the optical filter 20A in comparative example 1.

FIG. 9 shows an optical image of the optical filter 10A in example 1, and FIG. 10 shows an optical image of the optical filter 20A in comparative example 1. The optical filter 10A in example 1 and the optical filter 20A in comparative example 1 are each a film having a size of about 5 cm×about 10 cm located so as to cover a front surface of the device. As seen from FIG. 9 and FIG. 10, both of the films exhibit a white color. Therefore, the optical filter 10A in example 1 is preferably usable as an infrared-transmissive filer and also has a high level of design quality because of the white color. Needless to say, a surface of the optical filter 10A in example 1 may be provided with a color or a pattern by printing or the like. The advantages of an optical filter according to an embodiment of the present invention will be described in detail below.

The optical characteristics of an optical filter may be evaluated as follows.

Figure 11:
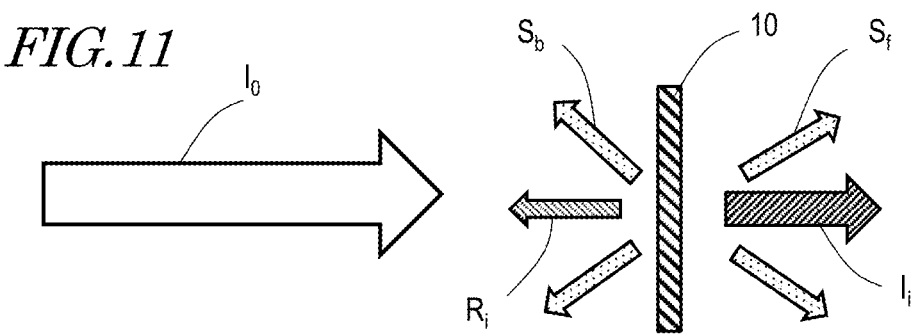
FIG. 11 is a schematic view illustrating optical characteristics of the optical filter 10 according to an embodiment of the present invention.

As shown in FIG. 11, when incident light $I_0$ is incident on the optical filter 10, a part of the incident light $I_0$ is transmitted through the optical filter (transmitted light $I_t$), another part of the incident light $I_0$ is reflected at an interface (interface-reflected light $R_i$), and the remaining part of the incident light $I_0$ is scattered. The scattered light includes forward scattered light $S_f$ output forward with respect to the optical filter 10 and rearward scattered light $S_b$ output rearward with respect to the optical filter 10. The rearward scattered light $S_b$ causes the optical filter 10 to exhibit a white color. A part of the incident light $I_0$ is absorbed by the optical filter 10, but the resin and the silica fine particles used herein have a low absorbance for light of 400 nm to 2000 nm.

Figure 12:
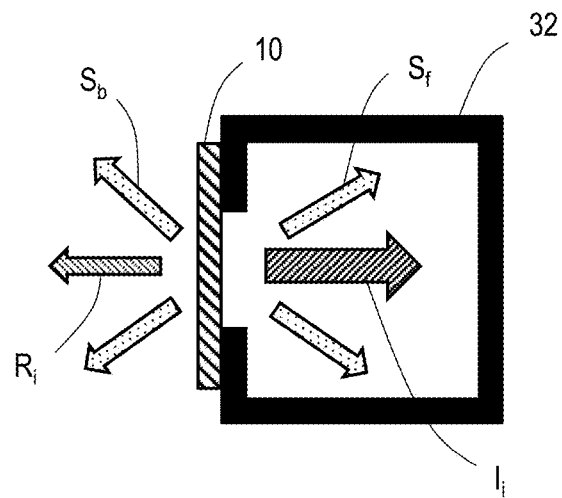
FIG. 12 is a schematic view showing a method for measuring a diffuse transmittance of an optical filter.
Figure 13:
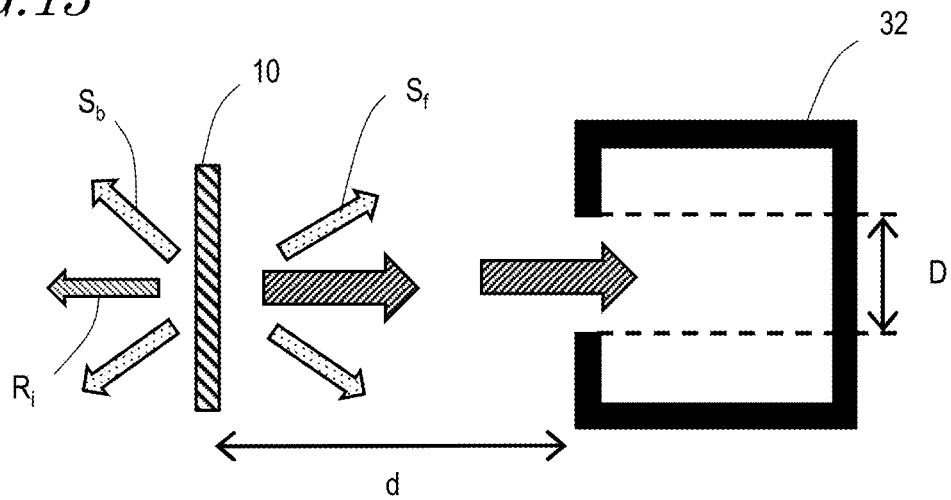
FIG. 13 is a schematic view showing a method for measuring a regular transmittance of an optical filter.
Figure 14:
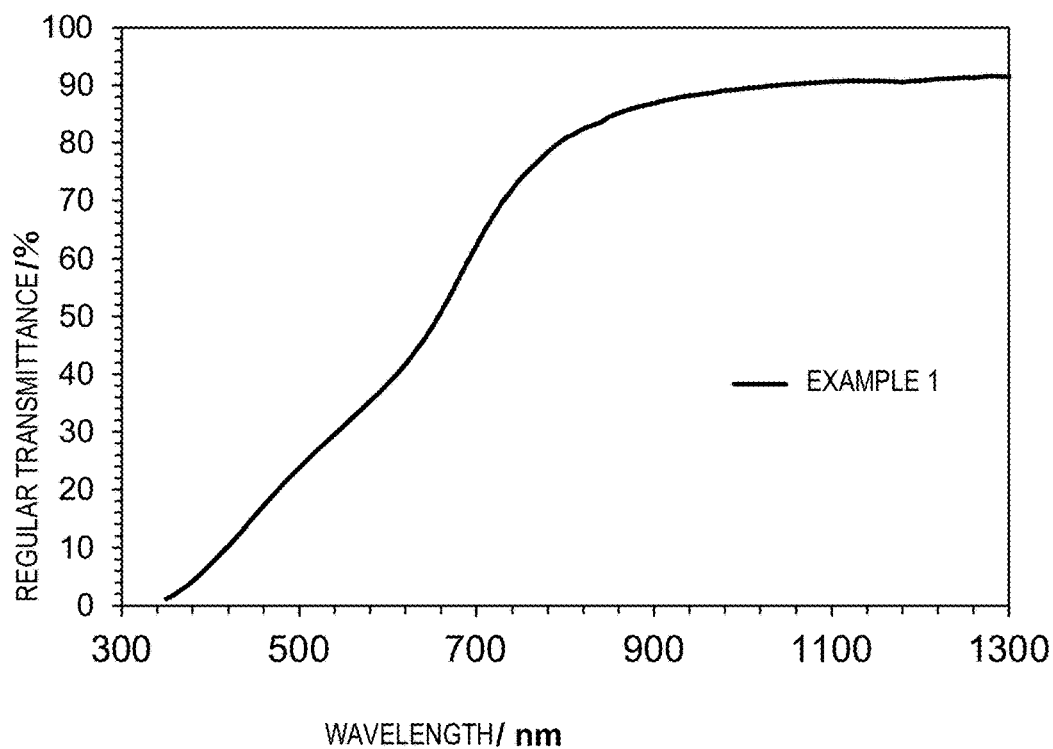
FIG. 14 shows a regular transmittance spectrum of the optical filter 10A in example 1.

FIG. 12 is a schematic view showing a method for measuring a diffuse transmittance of an optical filter. FIG. 13 is a schematic view showing a method for measuring a regular transmittance of an optical filter. As shown in FIG. 12, with a sample (optical filter 10) being located in an opening of an integrating sphere 32, the diffuse transmittance was found as a percentage of the total intensity of the transmitted light $I_t$ and the forward scattered light $S_f$ with respect to the intensity of the incident light $I_0$. For measuring the regular transmittance, a sample (optical filter 10) was located at a position 20 cm (d=20 cm) away from the opening of the integrating sphere 32. The regular transmittance was found as a percentage of the intensity of the transmitted light $I_t$ obtained in this state with respect to the intensity of the incident light $I_0$. The opening has a diameter of 1.8 cm (D=1.8 cm), which corresponds to a solid angle of 0.025 sr. As a spectrometer, a UV-Visible/NIR Spectrometer UH4150 (produced by Hitachi High-Tech Science Corporation) was used. Table 1 shows the values of the regular transmittance for infrared rays of 760 nm, 950 nm and 1550 nm. Regular transmittance spectra of the samples are shown in FIG. 14 and the like. The presence/absence of Bragg reflection may be determined based on whether or not the regular transmittance spectrum has a dimple (local drop in the transmittance). Table 1 also shows the presence/absence of Bragg reflection.

The degree of whiteness of the rearward scattered light $S_b$ was measured by use of a spectrophotometer CM-2600-D (produced by Konica Minolta Japan, Inc.). The value of L* was found by the SCE (Specular Component Exclude) method, and also the values of x and y coordinates on the CIE 1931 chromaticity diagram were found. As the value of L* is larger and the values of the x and y coordinates are closer to 0.33, the degree of whiteness is higher. These values are also shown in Table 1.

Figure 15:
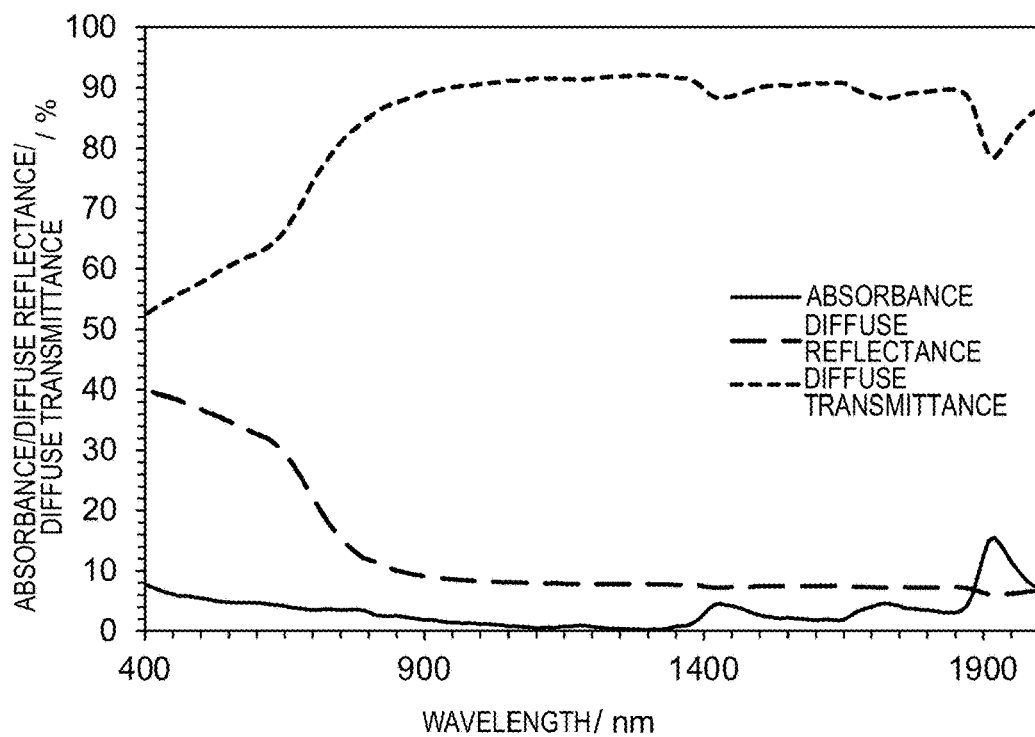
FIG. 15 shows an absorbance spectrum found as a difference between a diffuse transmittance spectrum and a diffuse reflectance spectrum of the optical filter 10A in example 1.

FIG. 14 shows a regular transmittance spectrum of the optical filter 10A in example 1, and FIG. 15 shows an absorbance spectrum of the optical filter 10A in example 1, which is found as a difference between a diffuse transmittance spectrum and a diffuse reflectance spectrum. As seen from FIG. 14, the optical filter 10A in example 1 has a high infrared transmittance. The infrared transmittance of the optical filter 10A is especially high for infrared rays having a wavelength of 900 nm or longer. Regarding the absorbance spectrum shown in FIG. 15, the absorbance of infrared rays of 1200 nm or longer is caused by the characteristic absorbance of the resin (organic compound) and is very low.

Figure 16:
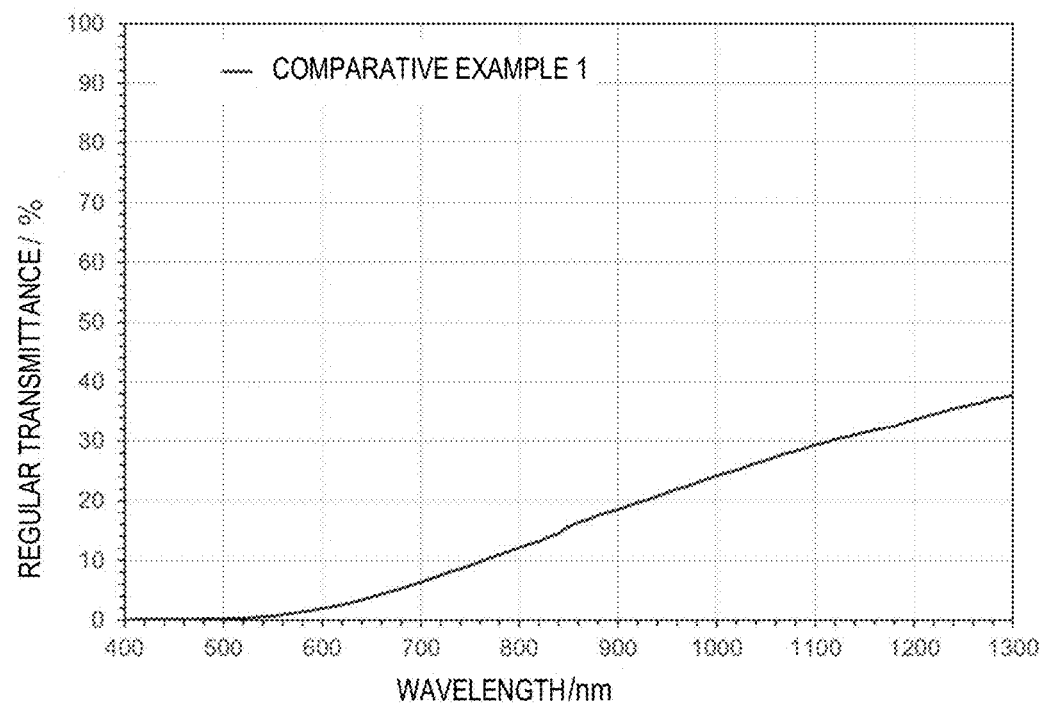
FIG. 16 shows a regular transmittance spectrum of the optical filter 20A in comparative example 1.

FIG. 16 shows a regular transmittance spectrum of the optical filter 20A in comparative example 1. As clearly seen from a comparison between FIG. 16 and FIG. 15, the transmittance of the optical filter 20A in comparative example 1 is low. As seen from a comparison between example 1 and comparative example 1 with reference to Table 1, the value of L* and the values of the x and y coordinates on the CIE chromaticity diagram, which show the degree of whiteness, are not much different between example 1 and comparative example 1, but the infrared regular transmittance is significantly different between example 1 and comparative example 1. A conceivable reason for this is that in comparative example 1, there is an influence of the flocculation of the silica fine particles as indicated by the CV value of 49.3%, which is much higher than the CV value of 27.8% in example 1. Namely, it is seen that the CV value may be an index usable to improve the infrared regular transmittance.

Figure 17:
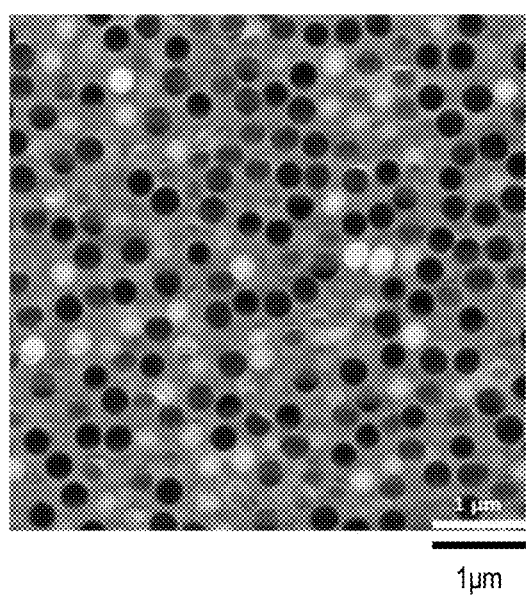
FIG. 17 shows an cross-sectional TEM image of an optical filter in example 2.
Figure 18:
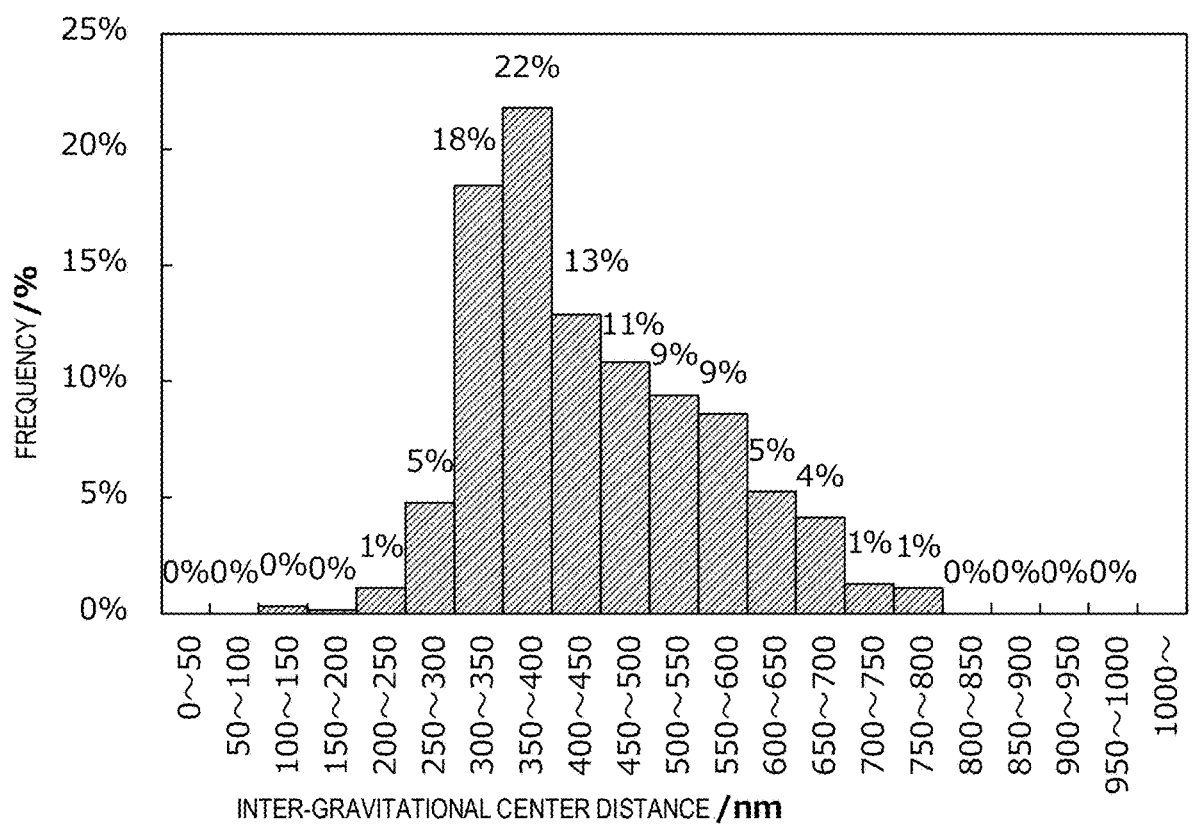
FIG. 18 shows a histogram of inter-gravitational center distances of particles found from the cross-sectional TEM image of the optical filter in example 2.
Figure 19:
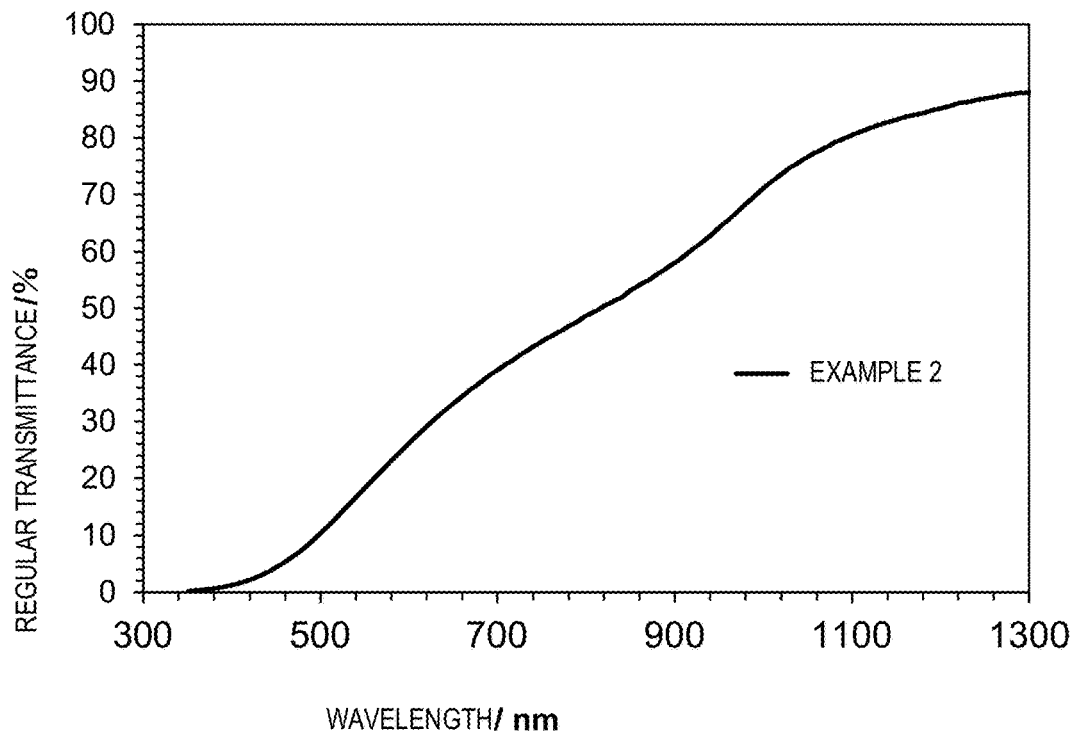
FIG. 19 shows a regular transmittance spectrum of the optical filter in example 2.

Now, with reference to FIG. 17 through FIG. 19, an optical filter in example 2 will be described. FIG. 17 shows a cross-sectional TEM image of the optical filter in example 2, and FIG. 18 shows a histogram of the inter-gravitational center distances of the particles found from the cross-sectional TEM image of the optical filter in example 2. FIG. 19 shows a regular transmittance spectrum of the optical filter in example 2. In example 1, the silica fine particles having an average particle diameter of 221 nm are used. By contrast, in example 2, silica fine particles having an average particle diameter of 296 nm are used. The CV value in example 2 is generally equal to the CV value in example 1, but the infrared regular transmittance is lower in example 2 than in example 1. Namely, it is seen that the infrared regular transmittance may be controlled by controlling the average diameter of the silica fine particles.

Figure 35:
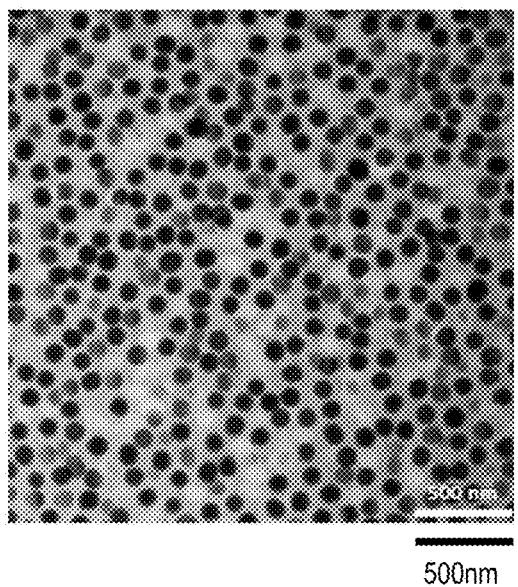
FIG. 35 shows a cross-sectional TEM image of an optical filter in comparative example 3.
Figure 36:
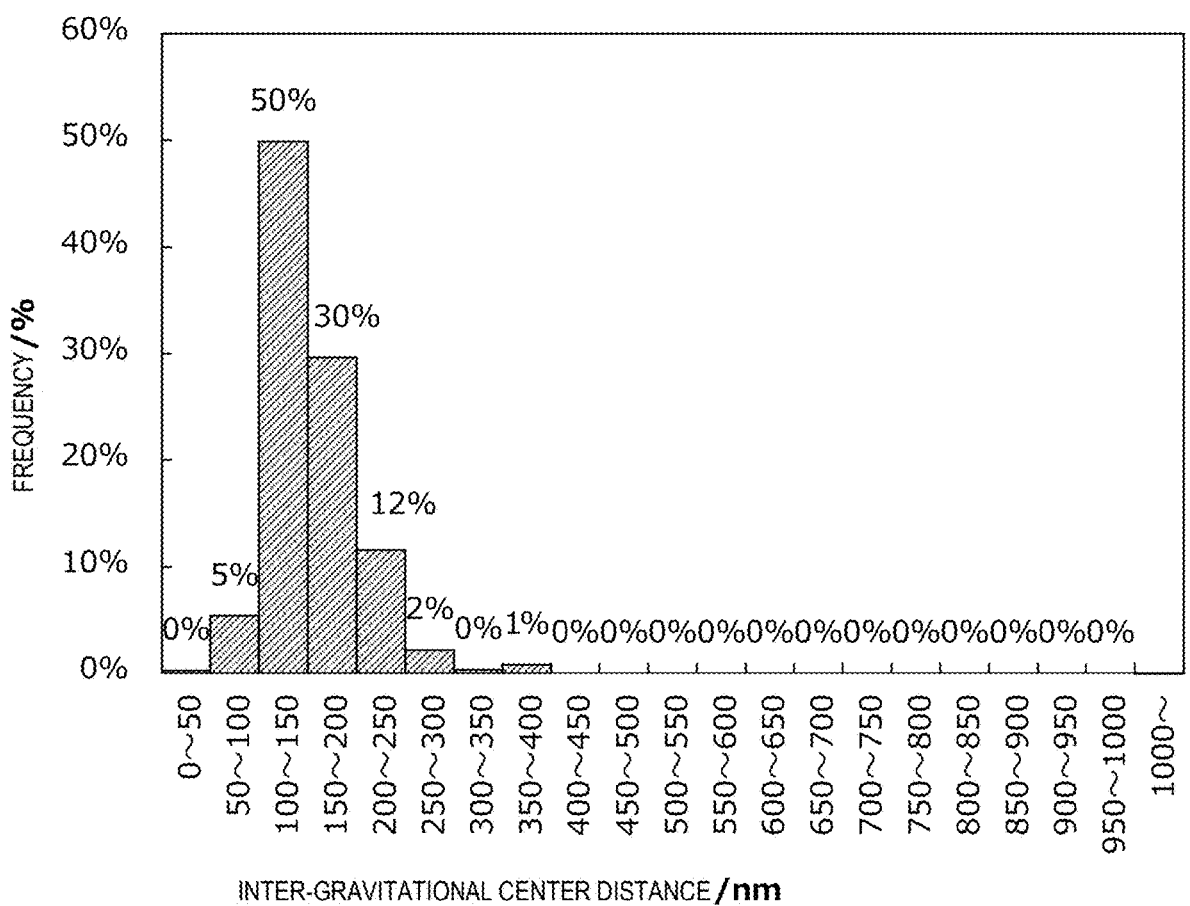
FIG. 36 shows a histogram of inter-gravitational center distances of particles found from the cross-sectional TEM image of the optical filter in comparative example 3.
Figure 37:
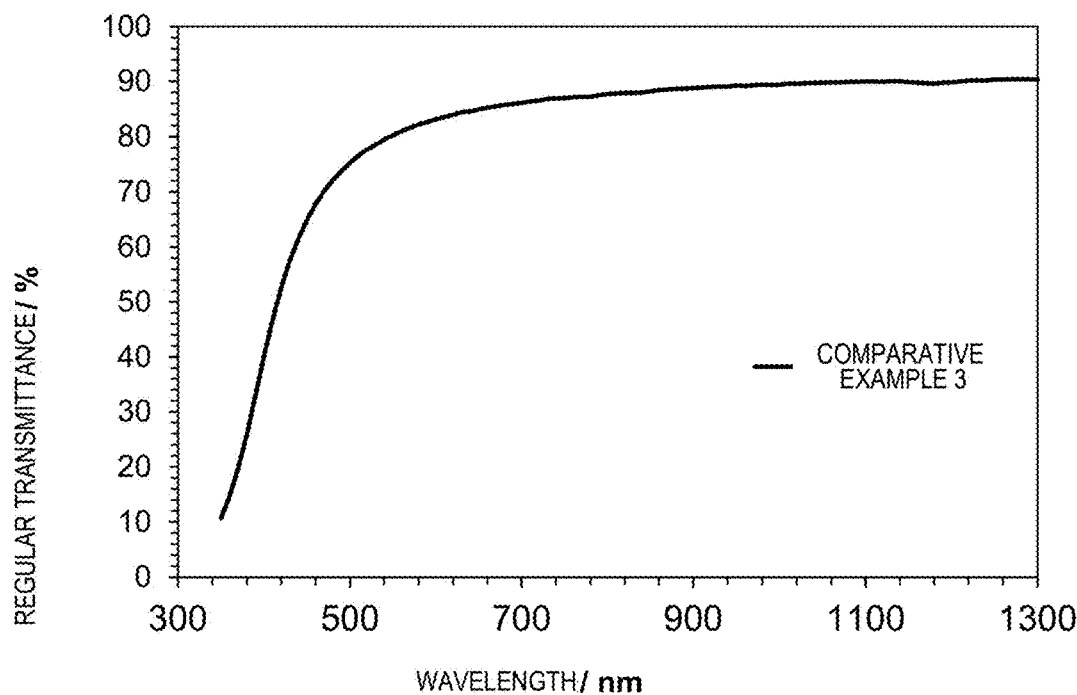
FIG. 37 shows a regular transmittance spectrum of the optical filter in comparative example 3.

Now, with reference to FIG. 35 through FIG. 37, an optical filter in comparative example 3 will be described for comparison. FIG. 35 shows a cross-sectional TEM image of the optical filter in comparative example 3, and FIG. 36 shows a histogram of the inter-gravitational center distances of the particles found from the cross-sectional TEM image of the optical filter in comparative example 3. FIG. 37 shows a regular transmittance spectrum of the optical filter in comparative example 3. Unlike in example 1 and example 2, in comparative example 3, silica fine particles having an average particle diameter of 110 nm are used. As clearly seen from the results shown in FIG. 37 and Table 1, the CV value in comparative example 3 is generally equal to the CV values in examples 1 and 2, but the infrared regular transmittance for infrared rays of 760 nm is as high as 87% and the visible light regular transmittance is also high in comparative example 3. The degree of whiteness is lower in comparative example 3 than in examples 1 and 2. From this, it is seen that the infrared regular transmittance and the degree of whiteness may be controlled by controlling the average diameter of the silica fine particles. From a comparison between example 1, example 2 and comparative example 3, it is considered to be preferred that the optical filter includes silica fine particles having an average particle diameter of 221 nm or longer.

Figure 20:
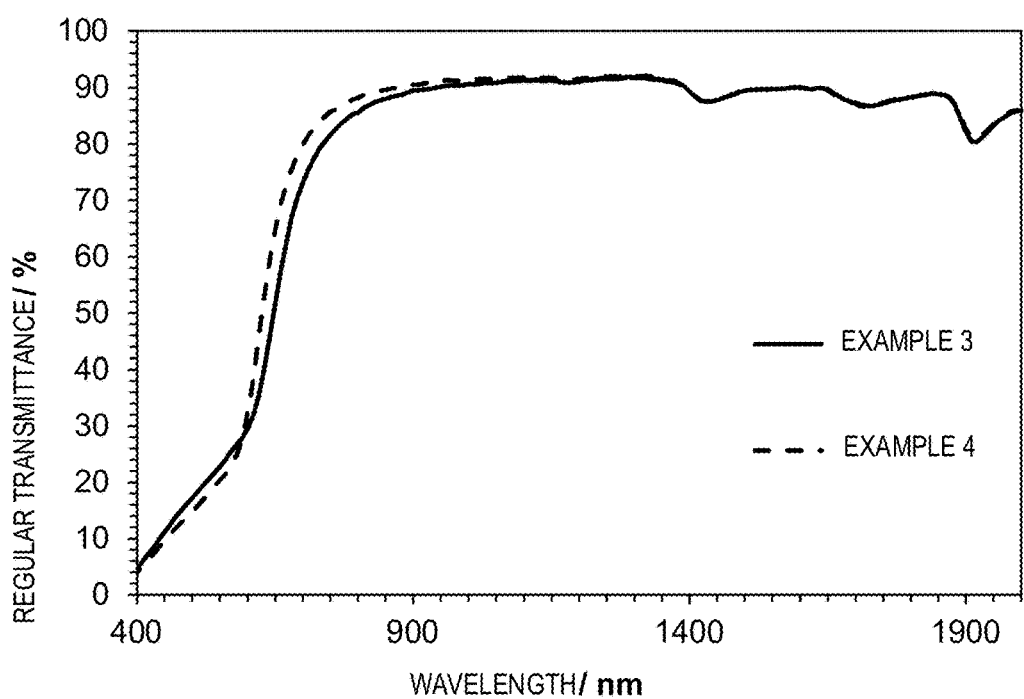
FIG. 20 shows regular transmittance spectra of optical filters in example 3 and example 4.

Now, with reference to FIG. 20, optical filters in example 3 and example 4 will be described. FIG. 20 shows regular transmittance spectra of the optical filters in examples 3 and 4. The optical filters in examples 3 and 4 respectively have volume fractions of silica fine particles of 34% and 38%, which are higher than 29% in example 1. In each of examples 3 and 4, as compared with the results in example 1, the infrared regular transmittance of infrared rays of each of 950 nm and 1550 nm and the x and y coordinates on the CIE chromaticity diagram are not much different, and the infrared regular transmittance of infrared rays of 760 nm and the value of L* are slightly higher. As seen from a comparison between the regular transmittance spectra in example 3 and example 4, as the volume fraction of the silica fine particles is increased, the wavelength of the scattered light is shifted to the shorter wavelength side and the value of L* is slightly increased.

Figure 25:
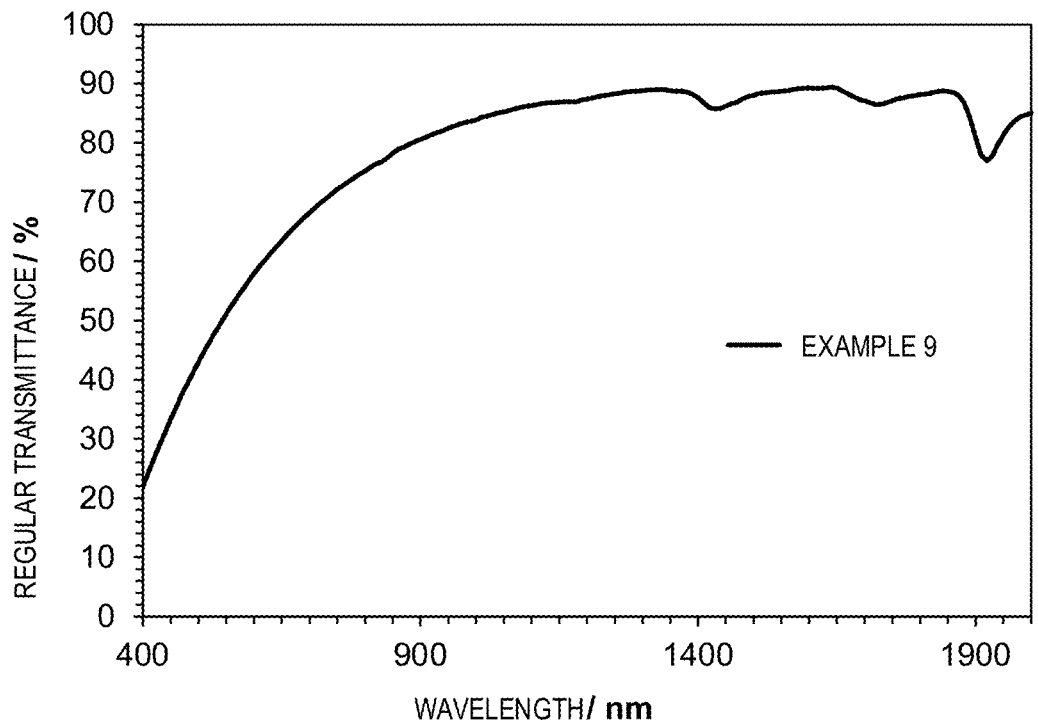
FIG. 25 shows a regular transmittance spectrum of an optical filter in example 9.

Now, an infrared regular transmittance of an optical filter in example 9 shown in FIG. 25 will be referred to for comparison. The optical filter in example 9 has a volume fraction of silica fine particles that is as low as 6%. In example 9, as compared with the results in example 1, the infrared regular transmittance of infrared rays of 950 nm is slightly lower and the value of L* is significantly lower. A conceivable reason for this is that the intensity of the scattered light is decreased by the decrease in the volume fraction of the silica fine particles.

As can be seen, the infrared regular transmittance and the value of L* may be controlled by controlling the volume fraction of the silica fine particles.

Figure 21:
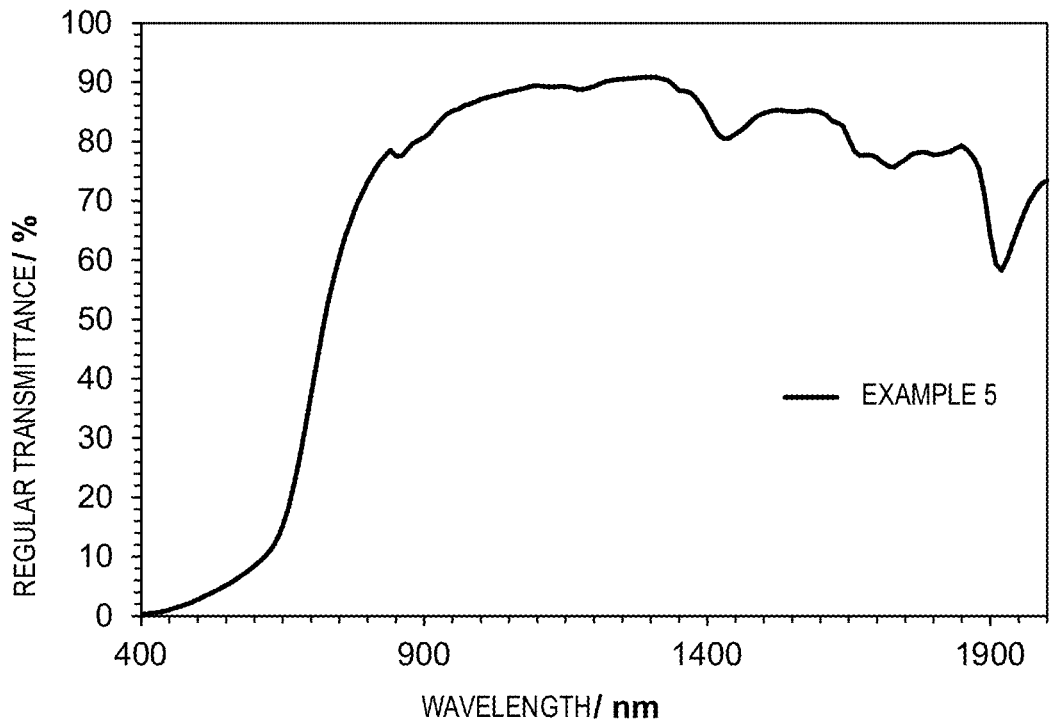
FIG. 21 shows a regular transmittance spectrum of an optical filter in example 5.

Now, with reference to FIG. 21, an optical filter in example 5 will be described. FIG. 21 shows a regular transmittance spectrum of the optical filter in example 5. The optical filter in example 1 has a thickness of 100 μm, whereas the optical filter in example 5 has a thickness of 500 μm. In example 5, as compared with example 1, the infrared regular transmittance is lower but the degree of whiteness is higher. The transmittance for the visible light may be decreased by increasing the thickness of the optical filter.

Figure 22:
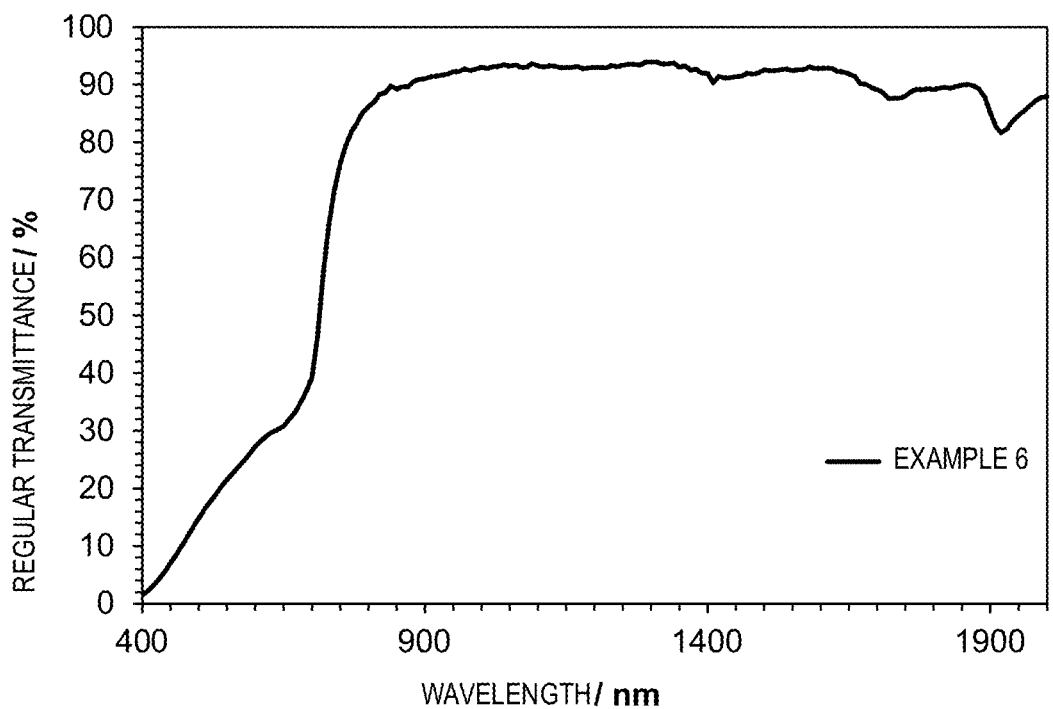
FIG. 22 shows a regular transmittance spectrum of an optical filter in example 6.

Now, with reference to FIG. 22, an optical filter in example 6 will be described. FIG. 22 shows a regular transmittance spectrum of the optical filter in example 6. In example 6, a monomer different from that in examples 1 through 5 is used and a polymer having a refractive index of 1.52 is contained to form a matrix. In examples 1 through 5, the refractive index of the matrix is 1.49 and the difference thereof from the refractive index of the silica fine particles of 1.43 is 0.06. By contrast, in example 6, the refractive index difference is as large as 0.09. In example 6, as compared with example 1, the infrared regular transmittance for infrared rays of each of 760 nm, 950 nm and 1550 nm and the value of L* are all higher.

Figure 23:
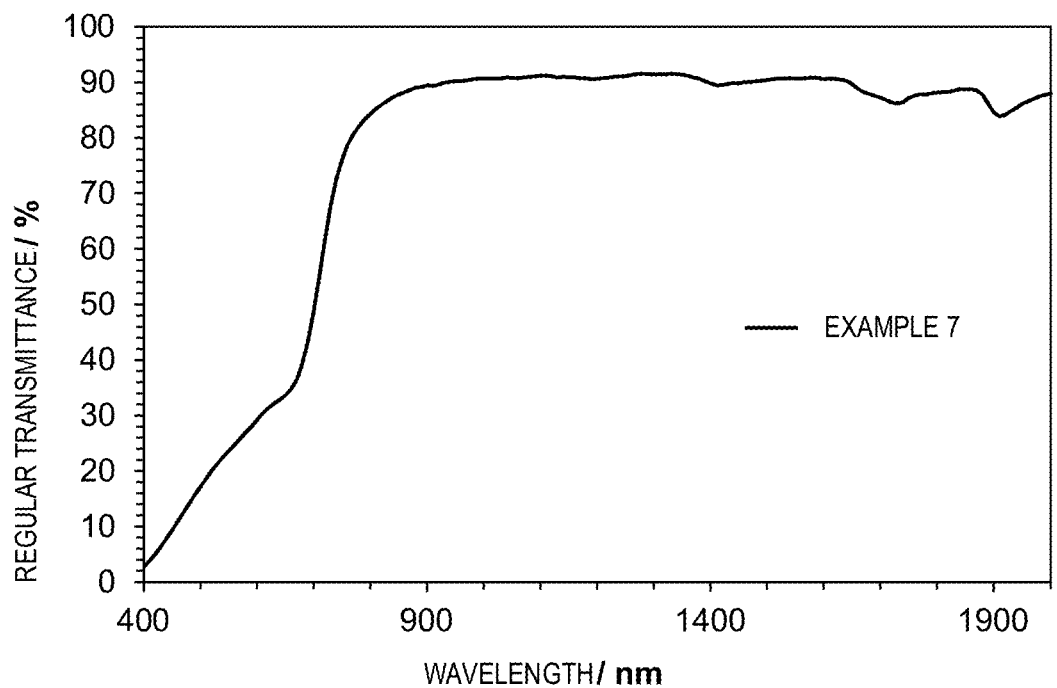
FIG. 23 shows a regular transmittance spectrum of an optical filter in example 7.

Now, with reference to FIG. 23, an optical filter in example 7 will be described. FIG. 23 shows a regular transmittance spectrum of the optical filter in example 7. In example 6, the optical filter is formed on a glass substrate. By contrast, in example 7, the optical filter is formed on a PET film. As seen from a comparison between FIG. 23 and FIG. 22 and between the results shown in Table 1, it is considered that there is little influence of the substrate.

Figure 24:
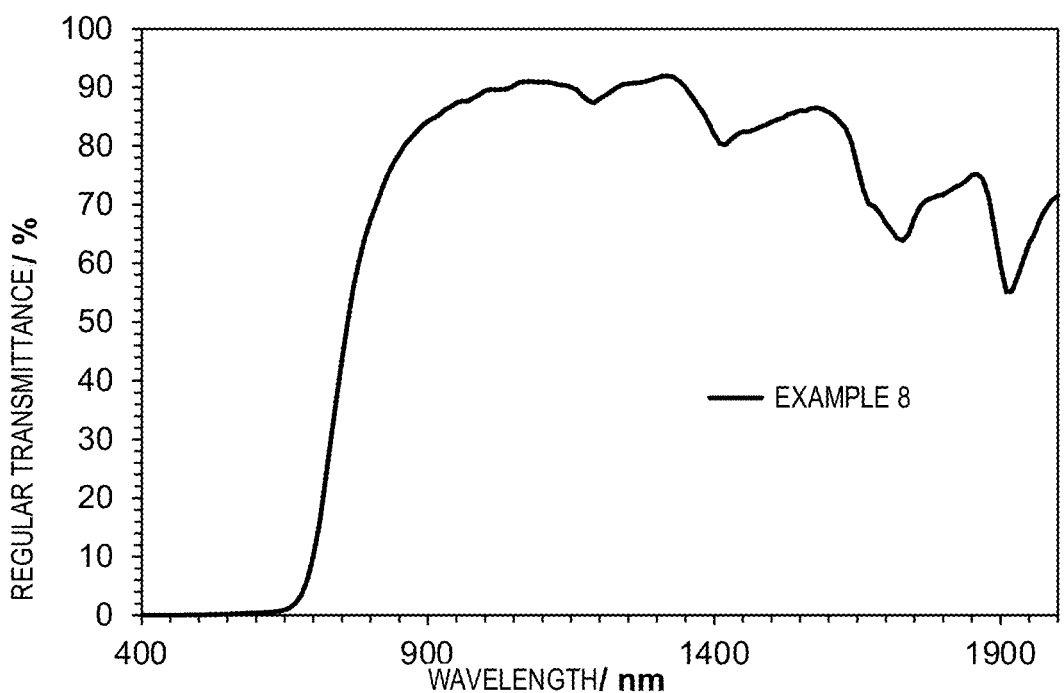
FIG. 24 shows a regular transmittance spectrum of an optical filter in example 8.

Now, with reference to FIG. 24, an optical filter in example 8 will be described. FIG. 24 shows a regular transmittance spectrum of the optical filter in example 8. The optical filter in example 7 has a thickness of 100 μm, whereas the optical filter in example 8 has a thickness of 500 μm. In example 8, as compared with example 7, the infrared regular transmittance is lower but the value of L* is higher. The transmittance for the visible light may also be decreased by increasing the thickness of the optical filter.

Figure 26:
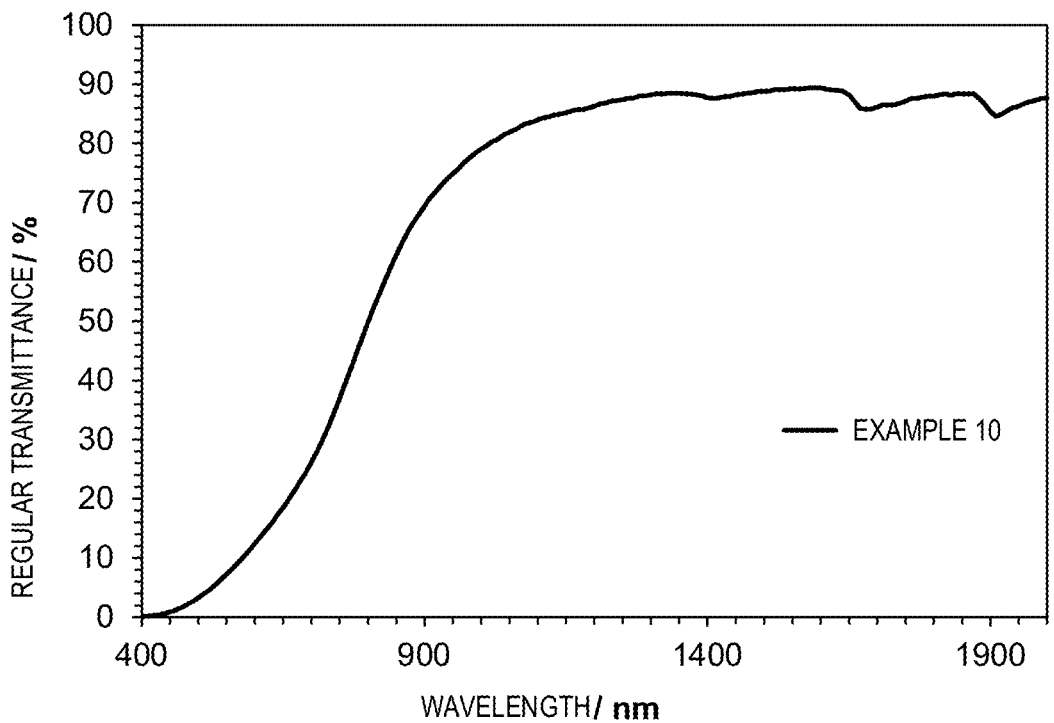
FIG. 26 shows a regular transmittance spectrum of an optical filter in example 10.
Figure 27:
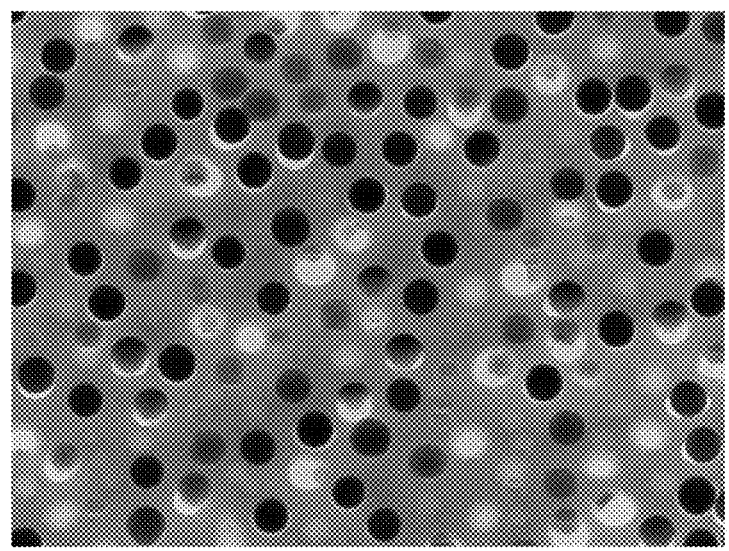
FIG. 27 shows a cross-sectional TEM image of the optical filter in example 10.
Figure 28:
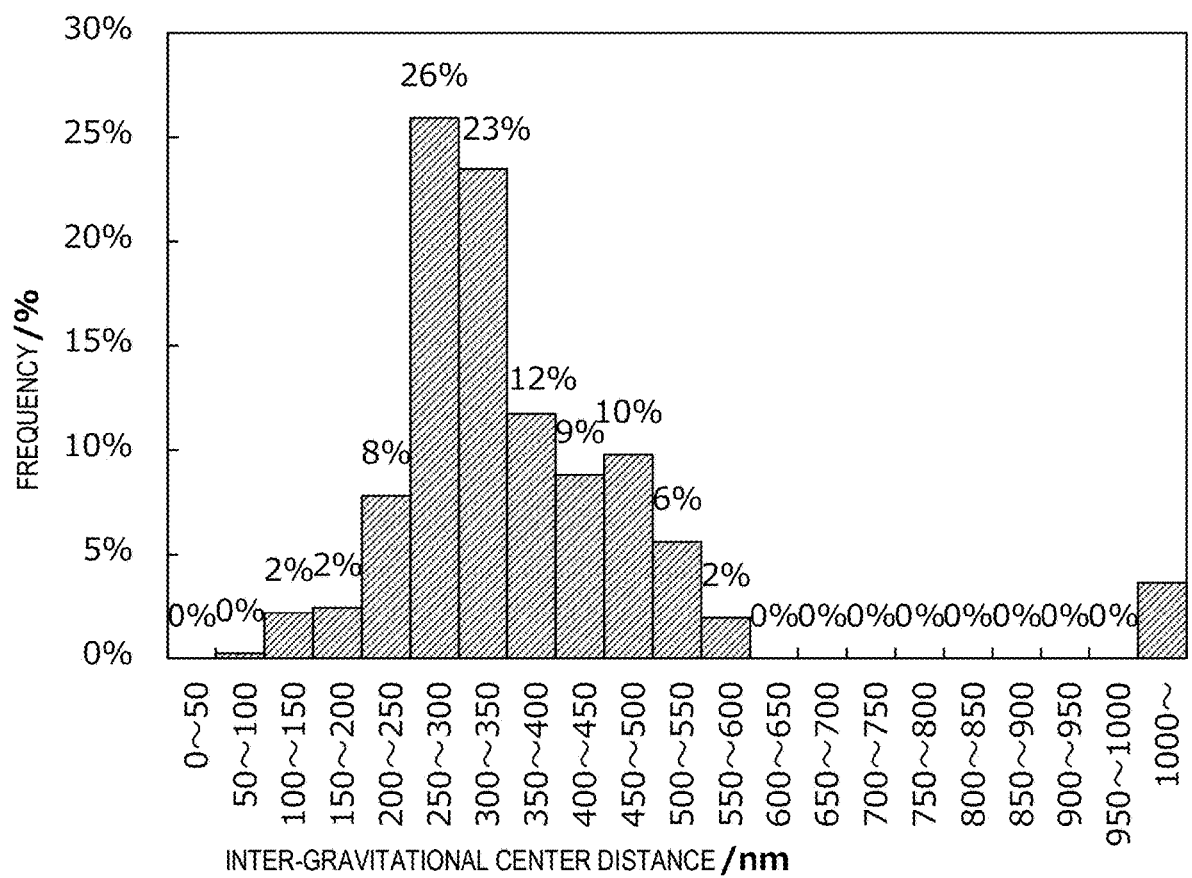
FIG. 28 shows a histogram of inter-gravitational center distances of particles found from the cross-sectional TEM image of the optical filter in example 10.

Now, with reference to FIG. 26 through 28, an optical filter in example 10 will be described. FIG. 26 shows a regular transmittance spectrum of the optical filter in example 10. FIG. 27 shows a cross-sectional TEM image of the optical filter in example 10. FIG. 28 shows a histogram of the inter-gravitational center distances of the particles found from the cross-sectional TEM image of the optical filter in example 10. In example 10, a polymer having a refractive index of 1.54 is contained to form a matrix. The refractive index difference from the silica fine particles is 0.11, which is larger than the refractive index difference in example 6. In example 10, as compared with examples 1 and 6, the infrared regular transmittance is lower and the value of L* is higher.

Figure 29:
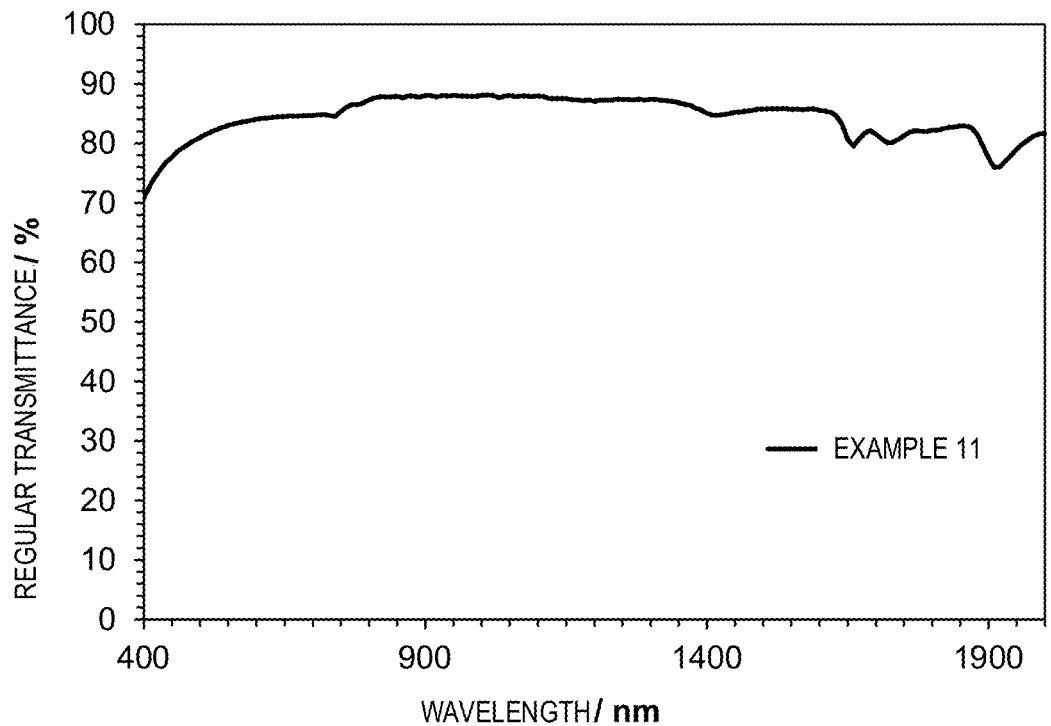
FIG. 29 shows a regular transmittance spectrum of an optical filter in example 11.

Now, with reference to FIG. 29, an optical filter in example 11 will be described. FIG. 29 shows a regular transmittance spectrum of the optical filter in example 11. In example 11, a polymer having a refractive index of 1.46 is contained to form a matrix. In example 11, the refractive index difference is as small as 0.03. It is seen in example 11, as compared with example 1, the infrared regular transmittance for infrared rays of 1550 nm is lower, the transmittance for light of the visible light region is higher, and the degree of whiteness is lower.

Figure 30:
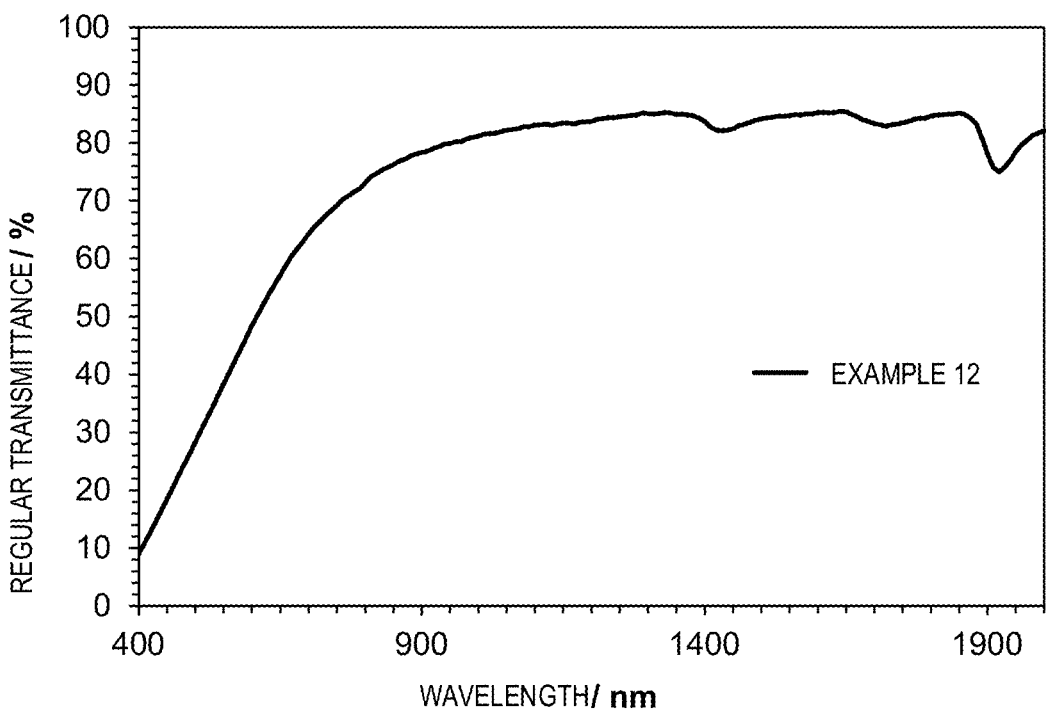
FIG. 30 shows a regular transmittance spectrum of an optical filter in example 12.

Now, with reference to FIG. 30, an optical filter in example 12 will be described. FIG. 30 shows a regular transmittance spectrum of the optical filter in example 12. Silica fine particles included in the optical filter in example 12 include silica fine particles having an average particle diameter of 110 nm and silica fine particles having an average particle diameter of 221 nm. The volume ratio (110 nm:221 nm) is 1:1. In example 12, as compared with example 1, the infrared regular transmittance and the degree of whiteness are both lower (see Table 1). This is considered to be an influence of the silica fine particles having an average particle diameter of 110 nm being mixed (see comparative example 3 and FIG. 37).

Figure 31:
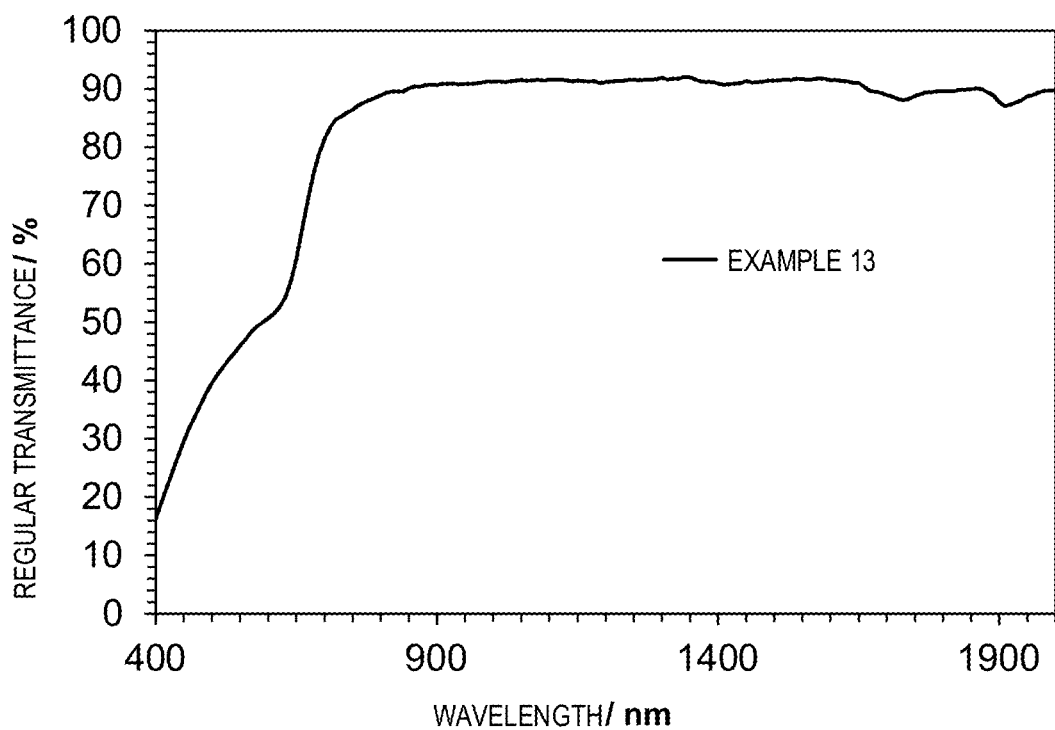
FIG. 31 shows a regular transmittance spectrum of an optical filter in example 13.

Now, with reference to FIG. 31, an optical filter in example 13 will be described. FIG. 31 shows a regular transmittance spectrum of the optical filter in example 13. Unlike the optical filter in example 6, the optical filter in example 13 uses silica fine particles having an average particle diameter of 181 nm. As seen from a comparison between FIG. 31 and FIG. 22, the wavelength at which the regular transmittance starts increasing is shorter in example 13 than in example 6. Namely, in the case of the optical filter in example 13, the regular transmittance for light of the visible light region is slightly higher than in example 6, and as a result, the value of L* and the degree of whiteness are slightly lower than in example 6. However, the infrared regular transmittance has a high value in example 13. It is seen that the silica fine particles having an average particle diameter of 181 nm are preferably usable. From the point of view of the degree of whiteness, it is preferred to include silica fine particles having an average particle diameter of 200 nm or longer, and it is more preferred to include silica fine particles having an average particle diameter of 221 nm or longer.

Figure 32:
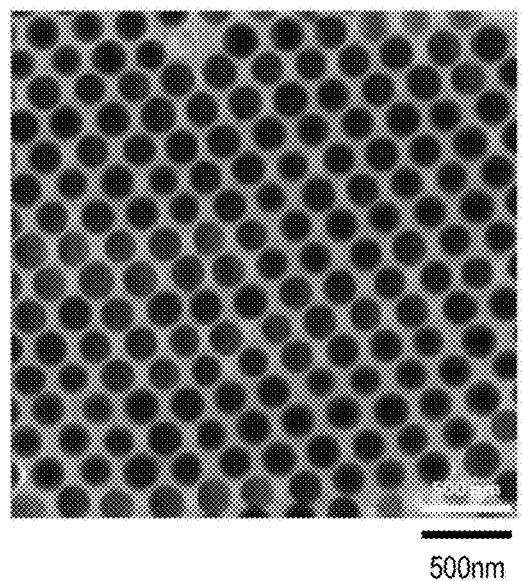
FIG. 32 shows a cross-sectional TEM image of an optical filter in comparative example 2.
Figure 33:
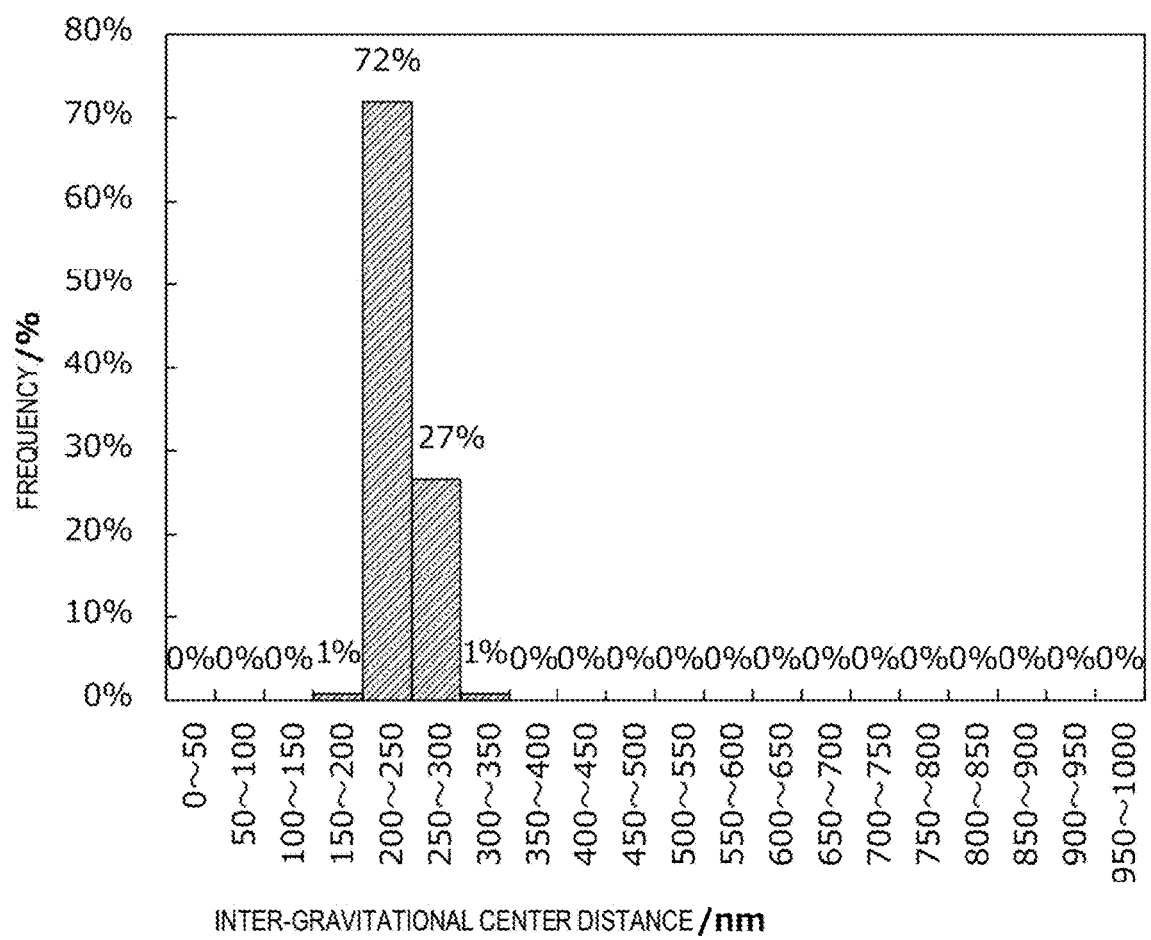
FIG. 33 shows a histogram of inter-gravitational center distances of particles found from the cross-sectional TEM image of the optical filter in comparative example 2.
Figure 34:
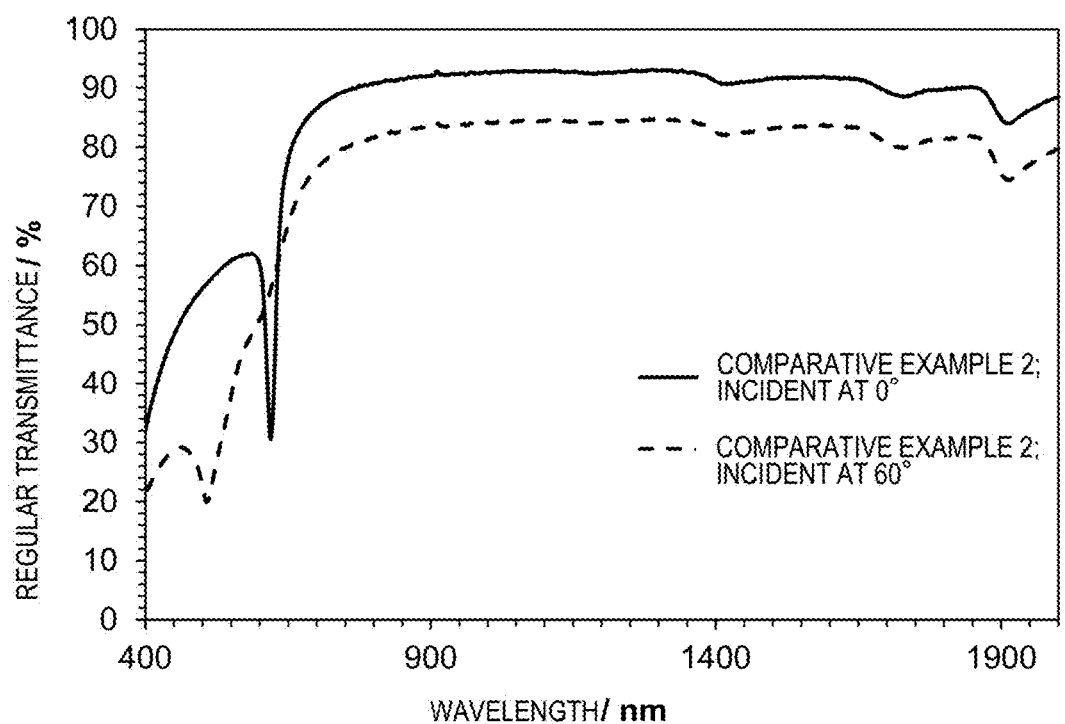
FIG. 34 shows regular transmittance spectra of the optical filter in comparative example 2 (angle of incidence: 0° and 60°).

Now, with reference to FIG. 32 through 34, an optical filter in comparative example 2 will be described. FIG. 32 shows a cross-sectional TEM image of the optical filter in comparative example 2. FIG. 33 shows a histogram of the inter-gravitational center distances of the particles found from the cross-sectional TEM image of the optical filter in comparative example 2. FIG. 34 shows regular transmittance spectra of the optical filter in comparative example 2, and shows results at angles of incidence of 0° and 60°. The angle of incidence of 0° is the direction normal to a surface of an optical filter. In comparative example 2, the optical filter includes a matrix that is formed of acrylic monomer E and has a refractive index of 1.48. The refractive index of the matrix is merely different by 0.01 from that in example 1. The angle-of-incidence dependence of the regular transmittance was measured by use of the Automatic Variable Angle System provided by the UV-Visible/NIR Spectrometer UH4150 (produced by Hitachi High-Tech Science Corporation), with the angle of the surface of the sample with respect to the incident light (angle of the optical filter 10 in FIG. 11) being varied.

As seen from FIGS. 32 and 33, the array of the silica fine particles in the optical filter in comparative example 2 has a long-distance order. As a result, the CV value shown in Table 1 is as low as 9.4%. Referring to FIG. 34, the regular transmittance spectrum has a steep dimple (local drop in the transmittance) in the visible light region. This steep dimple is caused by Bragg reflection. In the optical filter in comparative example 2, the array of the silica fine particles has a structure close to a colloidal crystal having a long-distance order or to a colloidal crystal, not a colloidal amorphous array. The steep dimple in the visible light region is shifted by the angle of incidence, and thus the optical filter in comparative example 2 is seen as exhibiting a different color in accordance with the angle at which the optical filter is viewed. Therefore, in order to suppress the Bragg reflection in the visible light region, it is considered to be preferred that the CV value is 10% or higher. From the results in comparative example 1 described above, in order to suppress the flocculation of the silica fine particles, it is considered to be preferred that the CV value is 49% or lower.

In the case of the optical filters in examples 1 through 13, the regular transmittance spectrum does not include any steep dimple, and the silica fine particles form a colloidal amorphous array. The regular transmittance for light having a wavelength in at least a part of the wavelength range that is not shorter than 760 nm and not longer than 2000 nm is 60% or higher. In the case where the standard light is from a D65 light source, the x and y coordinates on the CIE 1931 chromaticity diagram are in the ranges of 0.25≤x≤0.40 and 0.25≤y≤0.40. The color is suppressed from being seen as exhibiting a different color in accordance with the angle at which the optical filter is viewed.

As clearly seen from the above, an optical filter according to an embodiment of the present invention acquires desired optical characteristics (e.g., the infrared regular transmittance and the degree of whiteness) and is suppressed from being seen as exhibiting a different color in accordance with the angle at which the optical filter is viewed, by having the following adjusted: the refractive indices of the fine particles and the matrix, the average particle diameter of the fine particles, the volume fraction, the distribution (degree of aperiodicity), and the thickness. Optical filters having different optical characteristics may be used in a stacking manner. For a certain use, for example, a filter absorbing infrared rays and an optical filter according to an embodiment of the present invention may be used together in a stacking manner. As understood from FIG. 9, an optical filter according to an embodiment of the present invention exhibits a white color even when being used as being stacked on, for example, a filter exhibiting a black or any other color, and therefore, improves the level of design quality thereof.

An optical filter according to an embodiment of the present invention has a feature also in the angle-of-incidence dependence of the regular transmittance spectrum.

Figure 38:
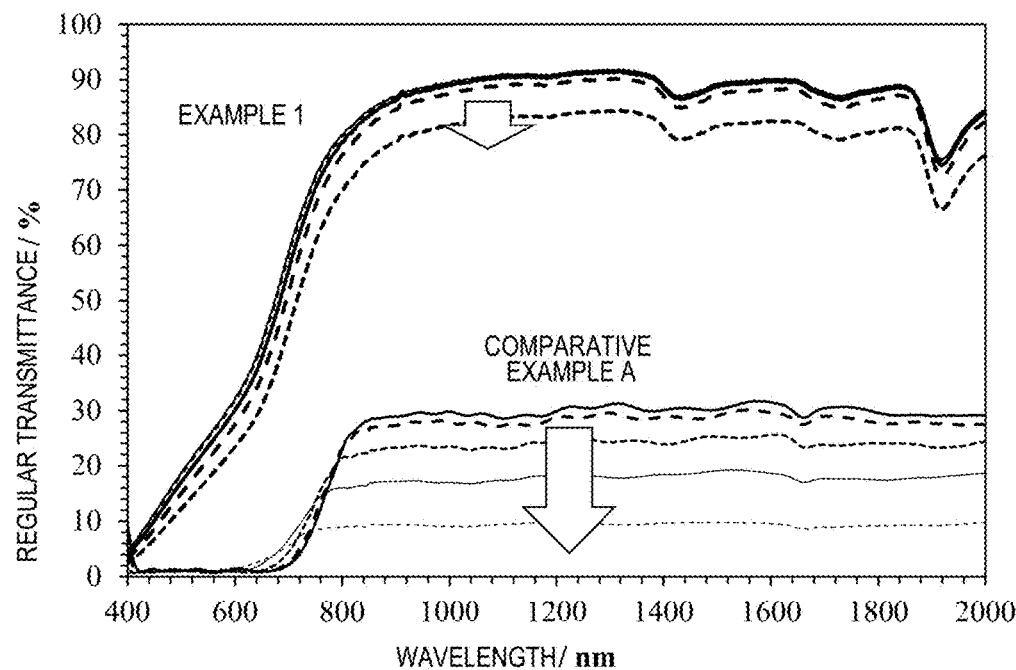
FIG. 38 shows the angle-of-incidence dependence of each of regular transmittance spectra of the optical filter 10A in example 1 and an optical filter in comparative example A.
Figure 39:
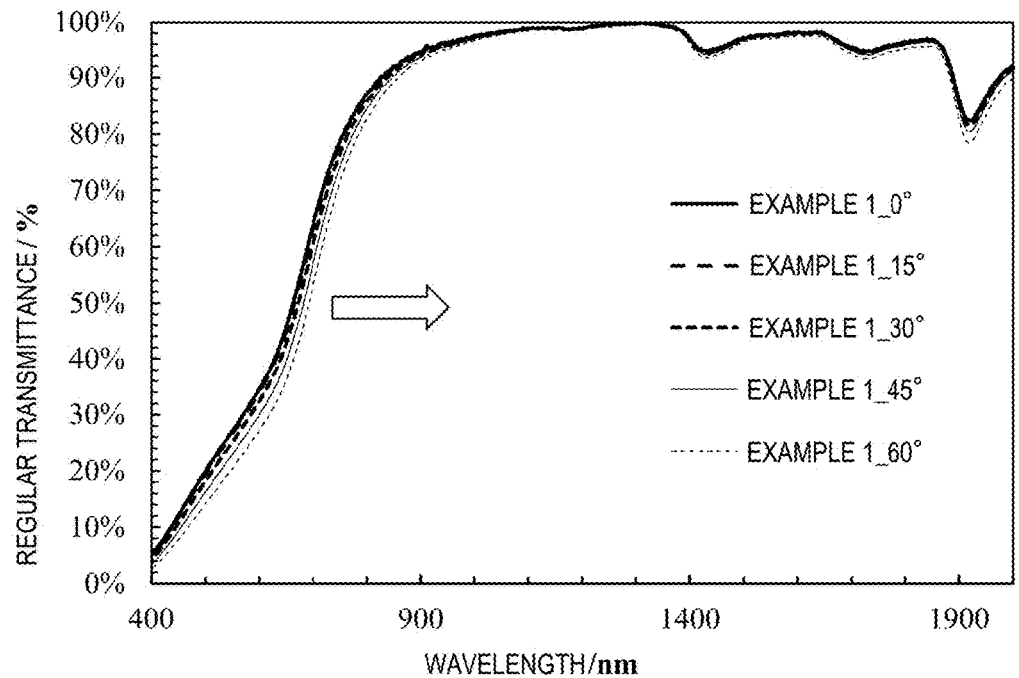
FIG. 39 shows the angle-of-incidence dependence of the regular transmittance spectrum of the optical filter 10A in example 1.
Figure 40:
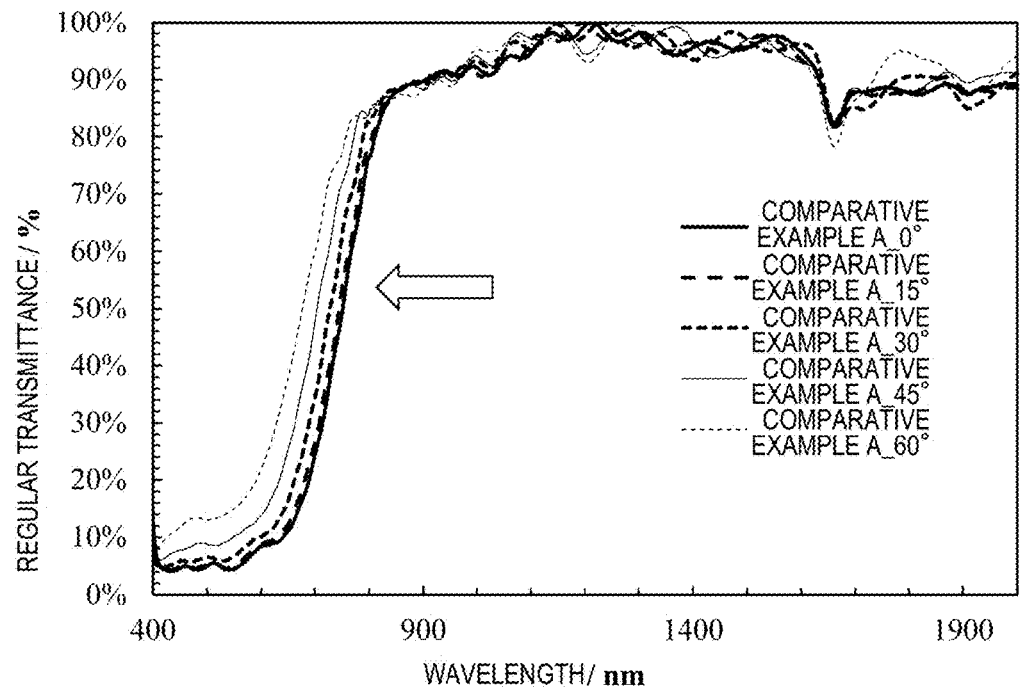
FIG. 40 shows the angle-of-incidence dependence of the regular transmittance spectrum of the optical filter in comparative example A.

With reference to FIG. 38 through FIG. 40, the angle-of-incidence dependence of the regular transmittance spectrum (angles of incidence: 0°, 15°, 30°, 45° and 60°) of each of the optical filter 10A in example 1 and an optical filter in comparative example A will be described. The optical filter in comparative example A is a commercially available infrared-transmissive filter produced by Tokai Optical Co., Ltd. under the name of White IR Window (https://www.tokaioptical.com/jp/product14/). The optical filter in comparative example A corresponds to the optical item described in Patent Document 2, and includes a dielectric multi-layer film and a PET film and has a matte-finished surface. The optical filter in comparative example A exhibits a white color and has a thickness of 120 μm.

FIG. 38 shows the angle-of-incidence dependence of the regular transmittance spectrum of each of the optical filter 10A in example 1 and the optical filter in comparative example A. FIG. 39 and FIG. 40 show the lines representing the angle-of-incidence dependence in example 1 and comparative example A normalized by the maximum transmittance. FIG. 39 shows the angle-of-incidence dependence of the regular transmittance spectrum of the optical filter 10A in example 1. FIG. 40 shows the angle-of-incidence dependence of the regular transmittance spectrum of the optical filter in comparative example A.

As seen from FIG. 38, the regular transmittance of the optical filter 10A in example 1 is higher than that of the optical filter in comparative example A. In the case of the optical filter 10A in example 1, the decrease in the infrared regular transmittance by the increase in the angle of incidence is smaller than in the case of the optical filter in comparative example A. For example, when the angle of incidence is 0°, the infrared regular transmittance for infrared rays of 950 nm is 88%, and when the angle of incidence is 60°, the infrared regular transmittance for infrared rays of the same wavelength is 80%, which is 90% or higher of the transmittance when the angle of incidence is 0°. By contrast, in the case of comparative example A, when the angle of incidence is 0°, the infrared regular transmittance for infrared rays of 950 nm is 30%, and when the angle of incidence is 60°, the infrared regular transmittance for infrared rays of the same wavelength is 9%, which is as low as 30% of the transmittance when the angle of incidence is 0°. As can be seen, the infrared regular transmittance of the optical filter according to an embodiment of the present invention has small angle-of-incidence dependence. For example, for the infrared rays of 950 nm, the regular transmittance when the angle of incidence is 60° is 80% or higher, 85% or higher, or even 90% or higher of the regular transmittance when the angle of incidence is 0°.

Figure 41:
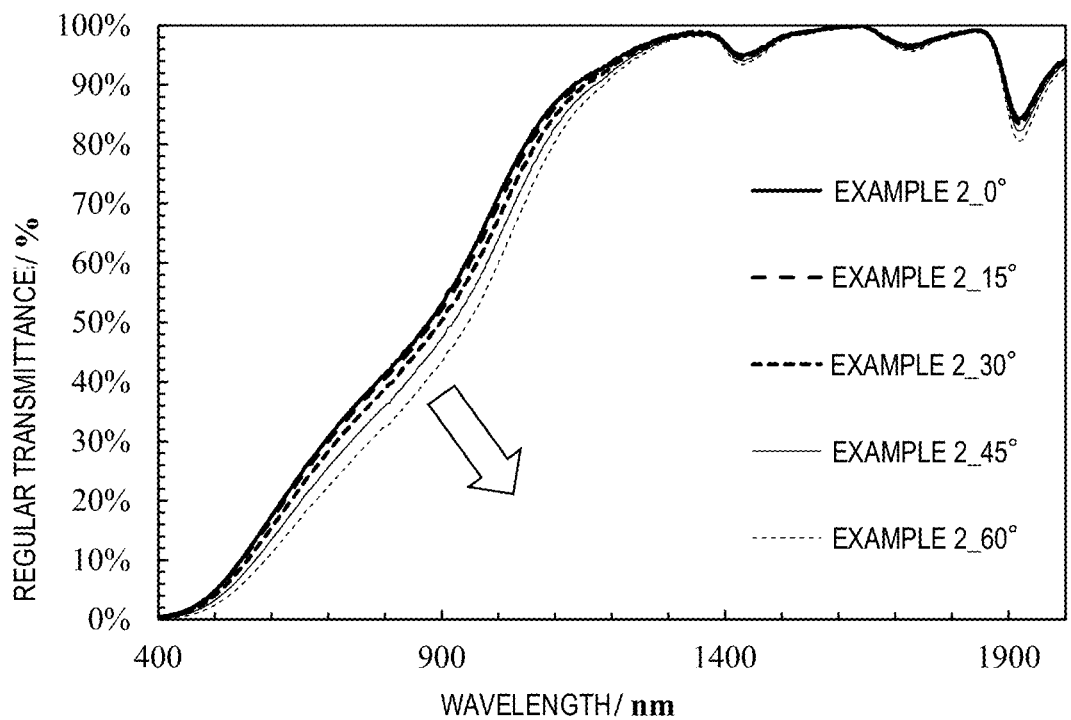
FIG. 41 shows the angle-of-incidence dependence of the regular transmittance spectrum of the optical filter in example 2.
Figure 42:
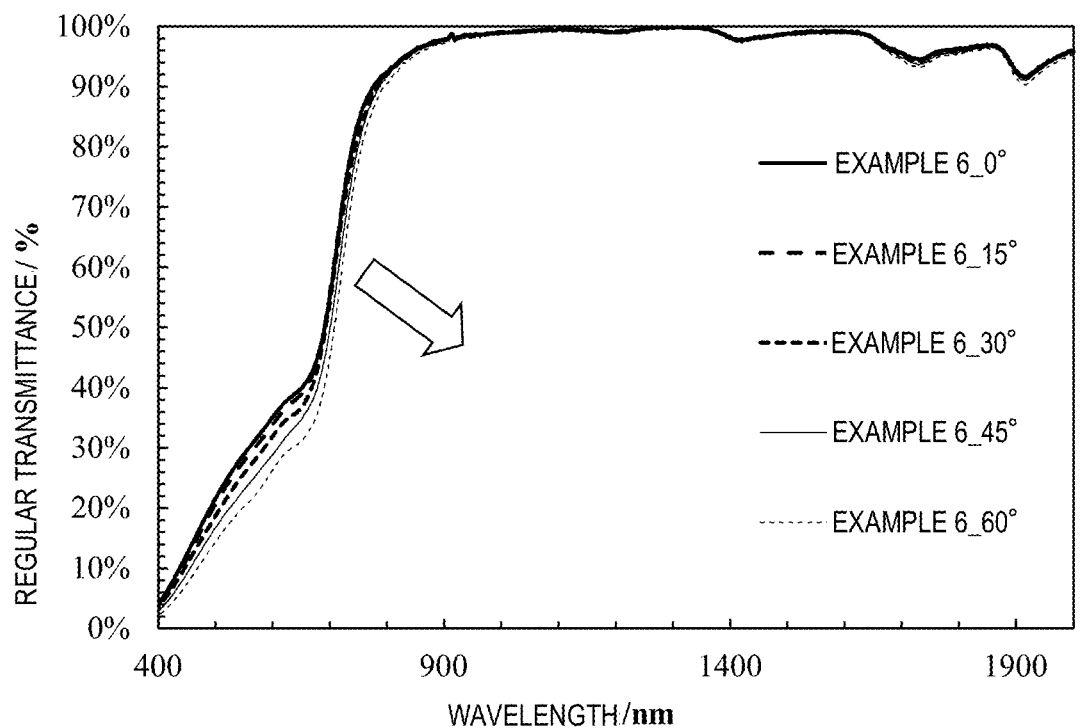
FIG. 42 shows the angle-of-incidence dependence of the regular transmittance spectrum of the optical filter in example 6.
Figure 43:
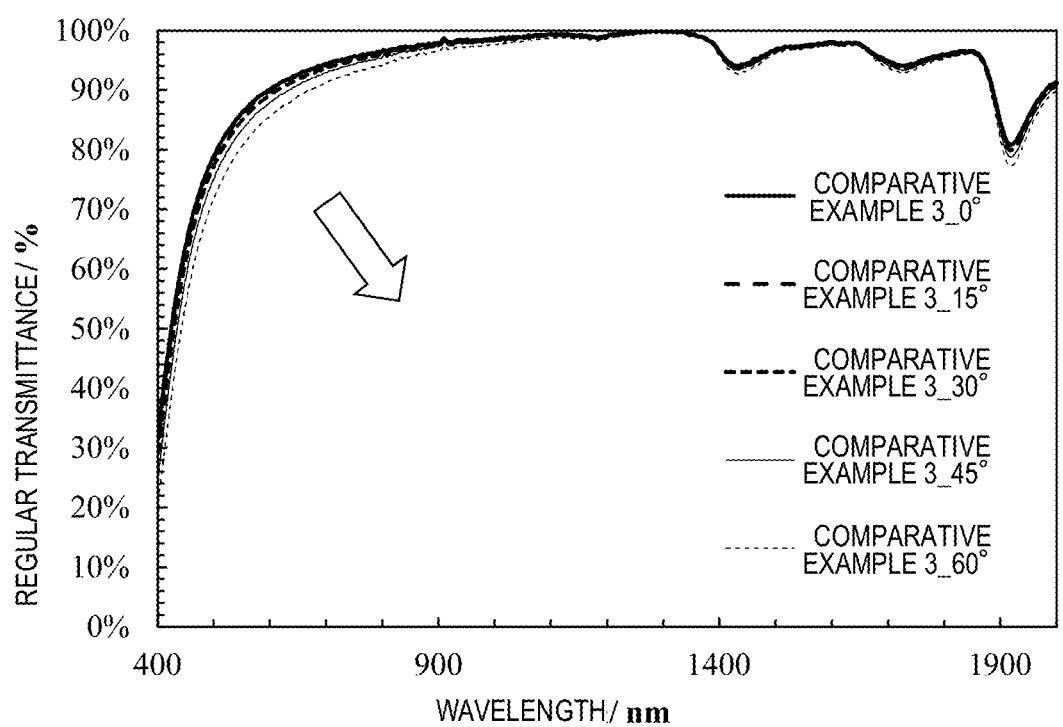
FIG. 43 shows the angle-of-incidence dependence of the regular transmittance spectrum of the optical filter in comparative example 3.

Regarding the transmittance curve of the optical filter 10A in example 1 shown in FIG. 39, the curved portion monotonously increasing from the visible light to the infrared rays is shifted to the longer wavelength side (by about 50 nm) as the angle of incidence is increased. Such characteristic angle-of-incidence dependence is also seen in the regular transmittance spectra of the optical filters in example 2, example 6 and comparative example 3 shown in FIG. 41, FIG. 42 and FIG. 43. Namely, the characteristic angle-of-incidence dependence that the curved portion monotonously increasing from the visible light to the infrared rays is shifted to the longer wavelength side as the angle of incidence is increased is considered to be caused by the silica fine particles included in the optical filter forming a colloidal amorphous array. By contrast, regarding the transmittance curve of the optical filter in comparative example A shown in FIG. 40, the curved portion monotonously increasing from the visible light to the infrared rays is shifted to the shorter wavelength side (by about 100 nm) as the angle of incidence is increased. Namely, the transmittance curves show exactly the opposite tendencies to each other.

In the case of the transmittance curve of the optical filter in comparative example A, the curved portion monotonously increasing from the visible light to the infrared rays is shifted to the shorter wavelength side as the angle of incidence is increased. Therefore, there is an undesirable possibility that the optical filter transmits obliquely incident light having a short wavelength that should be blocked (light leak). By contrast, in the case of the optical filter in which the silica fine particles form a colloidal amorphous array, the transmittance for light having a shorter wavelength is decreased as the angle of incidence is increased. Therefore, there is no possibility of light leak, unlike in the case of the optical filter in comparative example A.

An optical filter according to an embodiment of the present invention may exhibit a white color as described above. Therefore, an optical filter having a variety of colors and a high level of design quality may be provided by using infrared-transmissive ink to print, for example, a letter, a pattern or a photograph on a surface of the optical filter. Namely, an optical filter according to an embodiment of the present invention may include an optical filter layer including a matrix and fine particles, and a printed layer located on the optical filter layer and formed of infrared-transmissive ink. The printed layer may be directly formed on a surface of the optical filter layer, or the printed layer formed on a surface of a transparent film may be located on the optical filter layer. As the infrared-transmissive ink, any type of known infrared-transmissive ink may be selected in accordance with the use or the wavelength of the infrared rays to be transmitted.

An optical filter according to an embodiment may be a planar film as described above as an example, but may have any of various forms without being limited to this. An optical filter according to an embodiment may have a three-dimensional shape, and may be, for example, like a film having a three-dimensional shape. Specifically, for example, an optical filter may be formed on a surface of an object having a three-dimensional shape by use of a coating method. The surface of the object may have any shape, for example, may be a part of, or the entirety of, a sphere; a curved surface having any shape; a part of, or the entirety of, a surface of a polygonal object; or the like. It is preferred that the surface of the object does not scatter light.

Figure 44A:
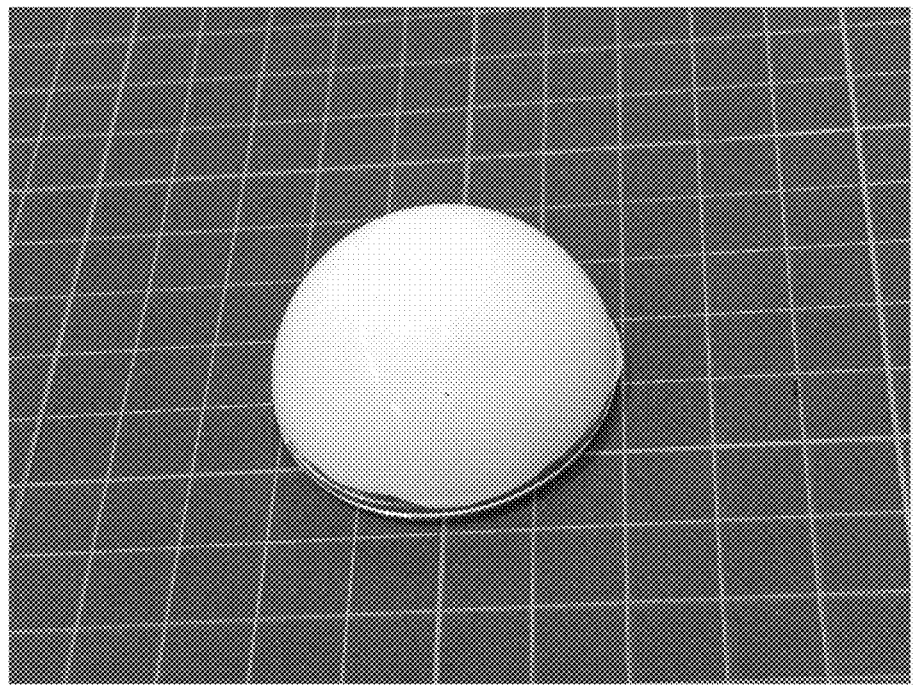
FIG. 44A shows an optical image (visible light) representing a semi-spherical optical filter in an example.
Figure 44B:
FIG. 44B shows an infrared image of the semi-spherical optical filter in the example shown in FIG. 44A.

For example, as shown in FIG. 44A and FIG. 44B, a semi-spherical optical filter may be formed. FIG. 44A shows an optical image (visible light) representing a semi-spherical optical filter in an example. FIG. 44B shows an infrared image of the semi-spherical optical filter in the example shown in FIG. 44A. The images shown in FIG. 44A and FIG. 44B are captured by use of a full hi-vision digital movie camera DVSA10FHDIR produced by Kenko Tokina Corporation. The image shown in FIG. 44A was captured under white LED illumination in a visible light mode. The image shown in FIG. 44B was captured in a dark room with only light from an infrared LED of the above-mentioned camera.

The optical filter shown in FIG. 44A and FIG. 44B has a thickness of 300 μm and was produced as follows. A surface of a semi-spherical object formed of an acrylic resin (PMMA) having a radius of 2 cm and a thickness of 1 mm was supplied with the same material as used in example 6 by dip coating. As shown in FIG. 44A, the filter is semi-spherical and is white. As shown in FIG. 44B, the filter transmits infrared rays.

Now, an optical filter according to an embodiment of the present invention that is preferably usable as an optical filter having a three-dimensional shape and has high isotropic back-scattering characteristics will be described in more detail. An optical filter having a three-dimensional shape includes a substrate and a film formed on the substrate as shown in FIG. 44A and FIG. 44B. The film has desired optical characteristics. The optical filter having a three-dimensional shape according to an embodiment of the present invention is not limited to such a type. The three-dimensional shape may include a three-dimensional curved surface. The "three-dimensional curved surface" encompasses, for example, a spherical surface or an ellipsoidal surface. The three-dimensional shape may include at least a part of a geometrically solid shape. The "geometrically solid shape" encompasses various shapes such as a spherical shape, an ellipsoidal shape, a polyhedral shape, a conical shape, a cylindrical shape, and the like. Examples of optical component that may include an optical filter in at least a part thereof include a three-dimensional Lidar, a vehicle emblem having a built-in camera, a robot housing, a game controller or a switch having a motion capture sensor mounted thereon, and a camera housing. The optical filter may be usable also as at least a part of a cover of an optical component.

As described above, an optical filter according to an embodiment of the present invention diffuse-reflects visible light and thus exhibits a white color. An optical filter according to an embodiment of the present invention may have a feature in back-scattering characteristics thereof. Hereinafter, it will be described that an optical filter according to an embodiment of the present invention has isotropic back-scattering characteristics. The back-scattering characteristics may be evaluated by a bidirectional reflectance distribution function (hereinafter, referred to simply as the "BRDF"). The BRDF refers to the scattering characteristics at a surface of a substance that are quantified as a constant inherent to the surface. The BRDF is a ratio between the (microscopic) illuminance and the luminance in a specific direction of incidence and a specific direction of reflection, and has the dimension of steradian$^{-1}$ (sr$^{-1}$).

Figure 45:
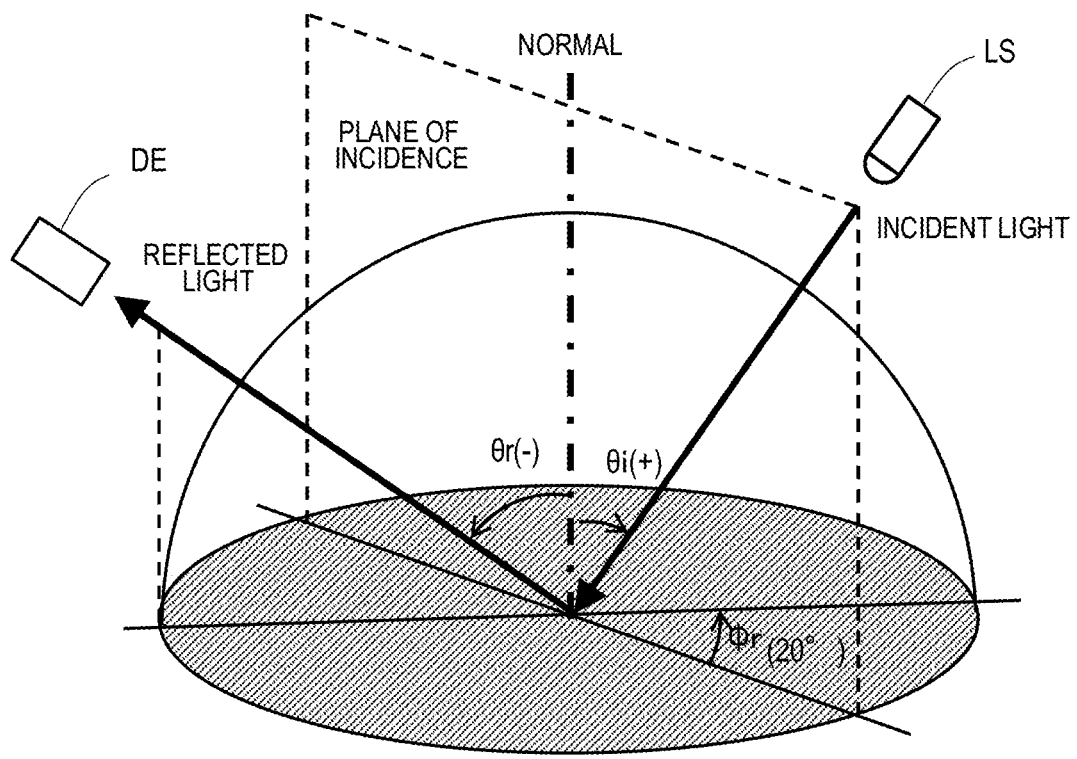
FIG. 45 schematically shows a BRDF measuring optical system.

BRDFs of samples of example 6 and comparative example A (flat films) described above were measured in various directions of incidence and various directions of reflection. FIG. 45 schematically shows a BRDF measuring optical system.

For measuring the BRDF, a goniophotometer GP-4L produced by Nikka Densok Limited was used. As a light source LS, a xenon lamp L11033 (150 W) produced by Hamamatsu Photonics K.K. was used. The samples were irradiated with light transmitted through a 550 nm bandpass filter (TS OD4 10 NM bandpass filter 550 NM 12.5 MM) produced by Edmund Optics. The diameter of the light beam used for the irradiation was set to 3 mm. As a detector DE, a photomultiplier tube (R13456) produced by Hamamatsu Photonics K.K. was used. The voltage was set to 430 V.

The angle θi of incidence from the light source LS toward the surface of each of the samples (polar angle of the incident light in the direction of incidence) was set to 0°, 30° and 60°. The BRDF was measured with, regarding the direction of reflection, the azimuth Φr from the plane of incidence being 20° and the polar angle θr being in the range of −70° to 70°. In the case where the angle θi of incidence is 0°, the azimuth Φr in the angle of reflection is 20°, and the polar angle θr in the angle of reflection is −70°, the BRDF (sr$^{-1}$) is represented as BRDF (0°; 20°, −70°).

Figure 46:
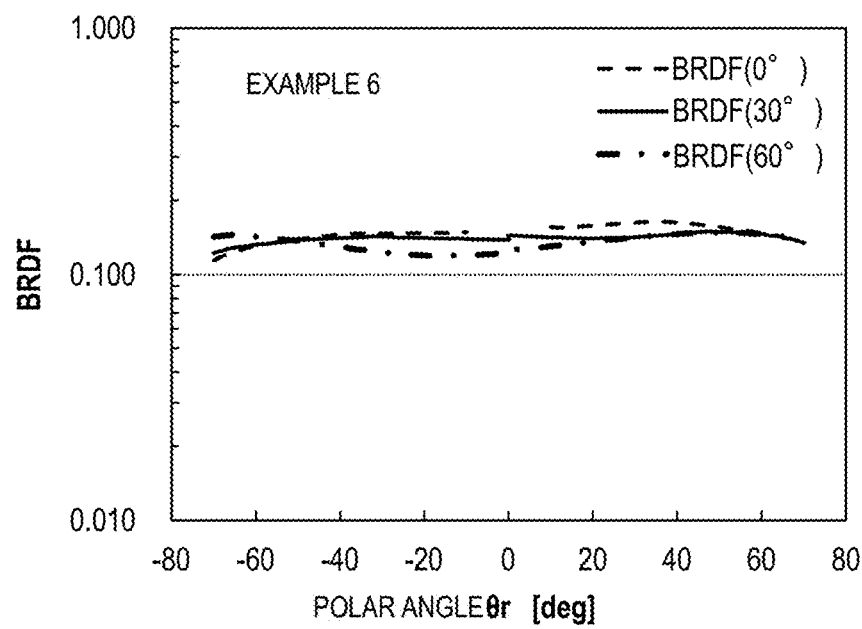
FIG. 46 is a graph showing BRDF values of a sample of the optical filter in example 6.
Figure 47:
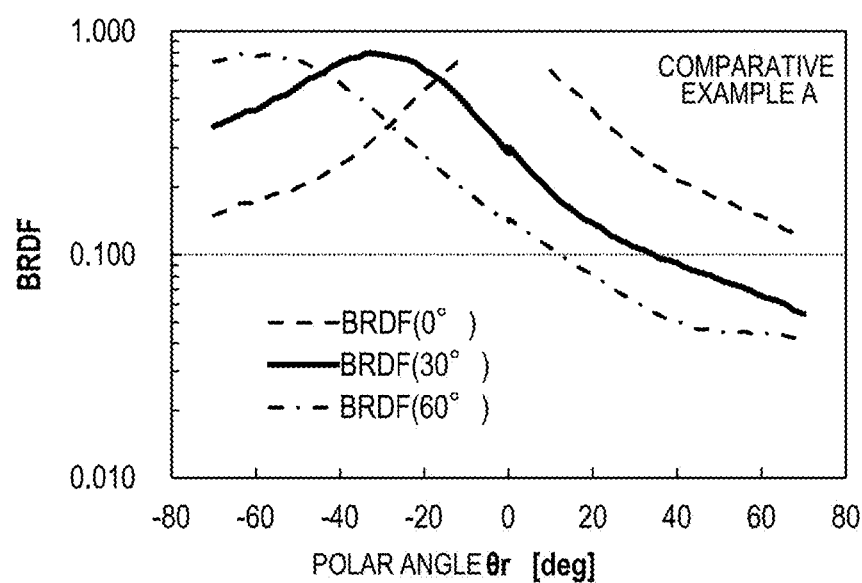
FIG. 47 is a graph showing BRDF values of a sample of the optical filter in comparative example A.

Tables 2 and 3 show the measurement results in example 6, and Tables 4 and 5 show the measurement results in comparative example A. In the case where the angle θi of incidence is 0° and the polar angle θr in the angle of reflection is in the range of −10° to 10°, an accurate measured value is not obtained due to the influence of the alignment of light source LS and the detector DE. In the case where the polar angle θr in the angle of reflection is in the range of 90° to 70°, the measured value is not shown because the detection error is large. Tables 2, 3, 4 and 5 show the measured values, the maximum values, the minimum values, the average values and the standard deviations of the BRDF. FIG. 46 shows the BRDF values of the sample of the optical filter in example 6. FIG. 47 shows the BRDF values of the sample of the optical filter in comparative example A.

Figure 48:
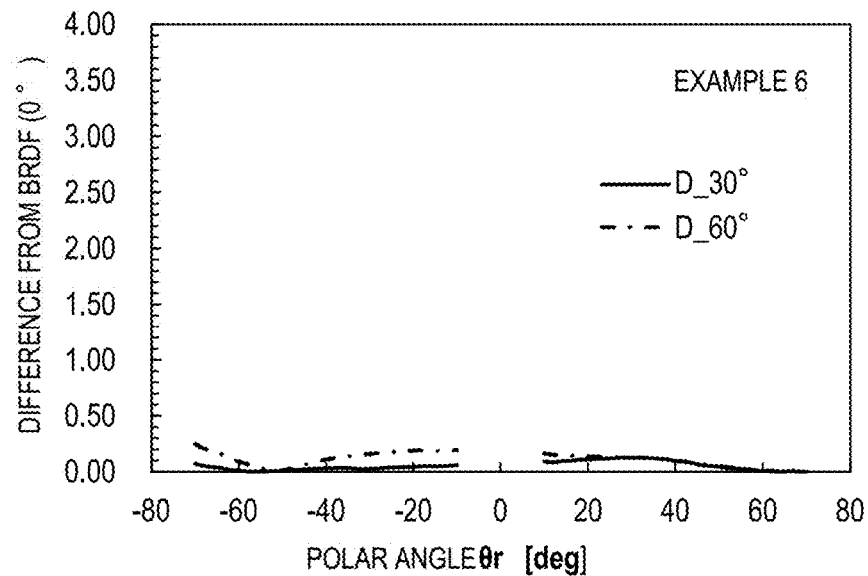
FIG. 48 is a graph showing differences of BRDF (30°) and BRDF (60°) from BRDF (0°) of the sample of the optical filter in example 6.
Figure 49:
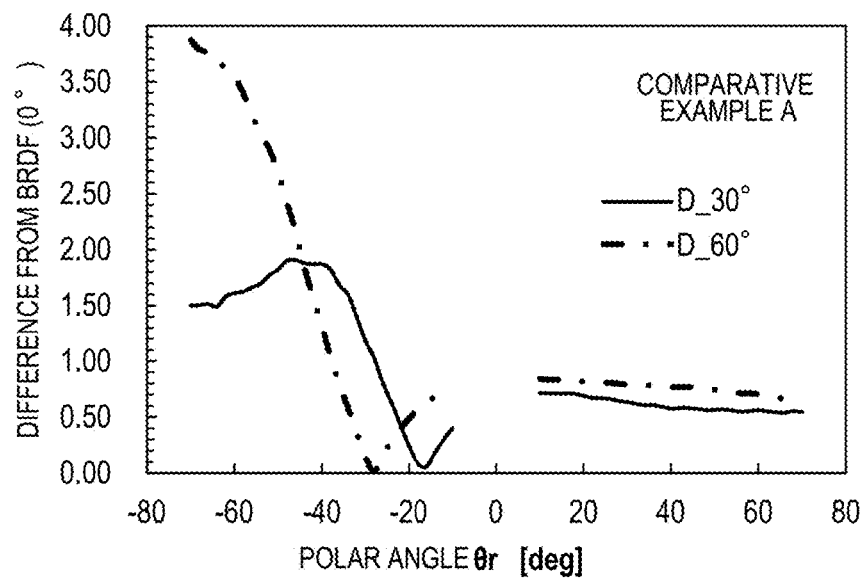
FIG. 49 is a graph showing differences of BRDF (30°) and BRDF (60°) from BRDF (0°) of the sample of the optical filter in comparative example A.

As parameters indicating the isotropy of the back-scattering characteristics, the difference between BRDF (0°) in the case where the angle θi of incidence was 0° and BRDF (30°) in the case where the angle θi of incidence was 30°, and the difference between BRDF (0°) in the case where the angle θi of incidence was 0° and BRDF (60°) in the case where the angle θi of incidence was 60°, were used. Specifically, |BRDF (0°; 20°, −60°)−BRDF (30°; 20°, −60°)|/BRDF (0°; 20°, −60°) and |BRDF (0°; 20°, −60°)−BRDF (60°; 20°, −60°)|/BRDF (0°; 20°, −60°) were used. Herein, "||" represents the absolute value. In Tables 2 and 3 and Tables 4 and 5, the difference of BRDF (30°) from BRDF (0°) is represented as D_30°, and the difference of BRDF (60°) from BRDF (0°) is represented as D_60°. FIG. 48 shows the differences of BRDF (30°) and BRDF (60°) from BRDF (0°), namely, D_30° and D_60°, of the sample of the optical filter in example 6. FIG. 49 shows the differences of BRDF (30°) and BRDF (60°) from BRDF (0°), namely, D_30° and D_60°, of the sample of the optical filter in comparative example A.

First, FIG. 46 and FIG. 48 will be referred to. In example 6, the BRDF values have small dependence on the polar angle θr regardless of whether the angle θi of incidence is 0°, 30° or 60°. As shown in Tables 2 and 3, in the case where the angle θi of incidence is 30°, the maximum value of BRDF (30°) is 0.150, the minimum value thereof is 0.123, the average value thereof is 0.14, and the standard deviation thereof is 0.005237. In the case where the angle θi of incidence is 60°, the maximum value of BRDF (60°) is 0.148, the minimum value thereof is 0.120, the average value thereof is 0.13, and the standard deviation thereof is 0.009855. The difference between BRDF (30°) and BRDF (60°) is small regardless of the polar angle θr. This is seen from that D_30° shown in FIG. 48 as the difference of BRDF (30°) from BRDF (0°) is as small as 0.13 at most and that D_60° shown in FIG. 48 as the difference of BRDF (60°) from BRDF (0°) is as small as 0.25 at most.

Now, FIG. 47 and FIG. 49 will be referred to. In comparative example A, as clearly seen from a comparison with FIG. 46 and FIG. 48 regarding example 6, the BRDF values have large dependence on the polar angle θr regardless of whether the angle θi of incidence is 0°, 30° or 60°. As shown in Tables 4 and 5, in the case where the angle θi of incidence is 30°, the maximum value of BRDF (30°) is 0.793, the minimum value thereof is 0.054, the average value thereof is 0.34, and the standard deviation thereof is 0.252327. In the case where the angle θi of incidence is 60°, the maximum value of BRDF (60°) is 0.789, the minimum value thereof is 0.042, the average value thereof is 0.28, and the standard deviation thereof is 0.269342. It is seen that the difference between BRDF (30°) and BRDF (60°) is especially large in the negative region of the polar angle θr. This is seen from that the maximum value of D_30°, which is the difference of BRDF (30°) from BRDF (0°) shown in FIG. 48, is as large as 1.91 and that the maximum value of D_60°, which is the difference of BRDF (60°) from BRDF (0°) shown in FIG. 48, is as large as 3.87.

From the above-described results, D_30° and D_60° are usable as parameters indicating that an optical filter according to an embodiment of the present invention has high isotropy of the back-scattering characteristics. Regarding the optical filter in example 6, D_30° (−30°) and D_60° (−30°) in the case where the polar angle θr is −30° are respectively 0.03 and 0.16. D_30° (−60°) and D_60° (−60°) in the case where the polar angle θr is −60° are respectively 0.01 and 0.09.

By contrast, regarding the optical filter in comparative example A, D_)30° (−30°) and D_60° (−30°) in the case where the polar angle θr is −30° are respectively 1.17 and 0.14. D_30° (−60°) and D_60° (−60°) in the case where the polar angle θr is −60° are respectively 1.61 and 3.55. As can be seen, in the case of the optical filter in comparative example A, |BRDF (0°; 20°, −60°)−BRDF (30°; 20°, −60°)|/BRDF (0°; 20°, −60° exceeds 1.0, or |BRDF (0°; 20°, −60°)−BRDF (60°; 20°, −60°)|/BRDF (0°; 20°, −60°) exceeds 1.0.

Therefore, regarding the index of the isotropy of the back-scattering characteristics, it is preferred that |BRDF (0°; 20°, −60°)−BRDF (30°; 20°, −60°)|/BRDF (0°; 20°, −60°) is 1.0 or smaller and that |BRDF (0°; 20°, −60°)−BRDF (60°; 20°, −60°)|/BRDF (0°; 20°, −60°) is 1.0 or smaller. It is more preferred that |BRDF (0°; 20°, −60°)−BRDF (30°; 20°, −60°)|/BRDF (0°; 20°, −60°) is 0.50 or smaller and that |BRDF (0°; 20°, −60°)−BRDF (60°; 20°, −60°)|/BRDF (0°; 20°, −60°) is 0.50 or smaller. It is still more preferred that |BRDF (0°; 20°, −60°)−BRDF (30°; 20°, −60°)|/BRDF (0°; 20°, −60°) is 0.25 or smaller and that |BRDF (0°; 20°, −60°)−BRDF (60°; 20°, −60°)|/BRDF (0°; 20°, −60°) is 0.25 or smaller. The optical film in example 6 exhibits high isotropy as represented by |BRDF (0°; 20°, −60°)−BRDF (30°; 20°, −60°)|/BRDF (0°; 20°, −60°) of 0.2 or smaller and |BRDF (0°; 20°, −60°)−BRDF (60°; 20°, −60°)|/BRDF (0°; 20°, −60°) of 0.2 or smaller.

In the above, the back-scattering characteristics of the optical film in example 6 are described regarding light having a wavelength of 550 nm used as an example of incident light having a wavelength in the visible light wavelength range. An optical filter according to an embodiment of the present invention may satisfy the above-mentioned relationship for light having a wavelength in at least a part of the visible light wavelength range, as well as the light having a wavelength of 550 nm. Namely, an optical filter according to an embodiment of the present invention is allowed to have a regular transmittance of 60% or higher for light having a wavelength in at least a part of the wavelength range not shorter than 760 nm and not longer than 2000 nm, and also to have high isotropy of the back-scattering characteristics for light having a wavelength in at least a part of the visible light wavelength range, by adjusting eighter one of the following: the refractive indices of the fine particles and the matrix, the average particle diameter of the fine particles, the volume fraction, the distribution (degree of aperiodicity), and the thickness.

TABLE 2

EXAMPLE 6

| REFLECTION POLAR ANGLE | BRDF AZIMUTH Φ r_20° | | | DIFFERENCE FROM BRDF (0°) | |
|---|---|---|---|---|---|
| | ANGLE OF INCIDENCE | ANGLE OF INCIDENCE | ANGLE OF INCIDENCE | | |
| θ r (°) | θ i_0° | θ i_30° | θ i_60° | D_30° | D_60° |
| −70 | 0.114 | 0.123 | 0.143 | 0.07 | 0.25 |
| −68 | 0.119 | 0.125 | 0.144 | 0.05 | 0.21 |
| −66 | 0.123 | 0.128 | 0.145 | 0.04 | 0.18 |
| −64 | 0.125 | 0.130 | 0.145 | 0.03 | 0.16 |
| −62 | 0.129 | 0.131 | 0.144 | 0.02 | 0.12 |
| −60 | 0.131 | 0.133 | 0.143 | 0.01 | 0.09 |

TABLE 2-continued

EXAMPLE 6

| REFLECTION POLAR ANGLE | BRDF AZIMUTH Φ r_20° | | | DIFFERENCE FROM BRDF (0°) | |
|---|---|---|---|---|---|
| | ANGLE OF INCIDENCE | ANGLE OF INCIDENCE | ANGLE OF INCIDENCE | | |
| θ r (°) | θ i_0° | θ i_30° | θ i_60° | D_30° | D_60° |
| −58 | 0.133 | 0.133 | 0.142 | 0.00 | 0.07 |
| −56 | 0.135 | 0.135 | 0.141 | 0.00 | 0.05 |
| −54 | 0.136 | 0.136 | 0.139 | 0.00 | 0.02 |
| −52 | 0.138 | 0.137 | 0.138 | 0.01 | 0.00 |
| −50 | 0.139 | 0.138 | 0.137 | 0.01 | 0.01 |
| −48 | 0.141 | 0.139 | 0.136 | 0.01 | 0.03 |
| −46 | 0.142 | 0.139 | 0.135 | 0.02 | 0.05 |
| −44 | 0.144 | 0.140 | 0.132 | 0.03 | 0.08 |
| −42 | 0.145 | 0.141 | 0.131 | 0.03 | 0.09 |
| −40 | 0.146 | 0.141 | 0.130 | 0.03 | 0.11 |
| −38 | 0.146 | 0.141 | 0.128 | 0.03 | 0.12 |
| −36 | 0.147 | 0.142 | 0.127 | 0.04 | 0.14 |
| −34 | 0.147 | 0.142 | 0.126 | 0.03 | 0.14 |
| −32 | 0.147 | 0.144 | 0.124 | 0.02 | 0.16 |
| −30 | 0.147 | 0.143 | 0.124 | 0.03 | 0.16 |
| −28 | 0.147 | 0.143 | 0.122 | 0.03 | 0.17 |
| −26 | 0.147 | 0.141 | 0.121 | 0.04 | 0.18 |
| −24 | 0.148 | 0.142 | 0.121 | 0.04 | 0.18 |
| −22 | 0.148 | 0.141 | 0.120 | 0.04 | 0.18 |
| −20 | 0.148 | 0.141 | 0.120 | 0.04 | 0.19 |
| −18 | 0.148 | 0.141 | 0.120 | 0.05 | 0.19 |
| −16 | 0.148 | 0.141 | 0.120 | 0.05 | 0.19 |
| −14 | 0.148 | 0.140 | 0.120 | 0.05 | 0.19 |
| −12 | 0.148 | 0.140 | 0.120 | 0.05 | 0.19 |
| −10 | 0.149 | 0.140 | 0.120 | 0.06 | 0.20 |
| −8 | — | 0.139 | 0.120 | — | — |
| −6 | — | 0.139 | 0.121 | — | — |
| −4 | — | 0.139 | 0.121 | — | — |
| −2 | — | 0.139 | 0.122 | — | — |
| 0 | — | 0.139 | 0.123 | — | — |
| 0 | — | 0.144 | 0.126 | — | — |

TABLE 3

| 2 | — | 0.144 | 0.127 | — | — |
|---|---|---|---|---|---|
| 4 | — | 0.144 | 0.128 | — | — |
| 6 | — | 0.143 | 0.128 | — | — |
| 8 | — | 0.142 | 0.129 | — | — |
| 10 | 0.156 | 0.142 | 0.131 | 0.09 | 0.16 |
| 12 | 0.155 | 0.142 | 0.132 | 0.09 | 0.15 |
| 14 | 0.156 | 0.141 | 0.132 | 0.10 | 0.15 |
| 16 | 0.156 | 0.141 | 0.134 | 0.10 | 0.15 |
| 18 | 0.158 | 0.140 | 0.135 | 0.11 | 0.14 |
| 20 | 0.158 | 0.140 | 0.136 | 0.11 | 0.14 |
| 22 | 0.159 | 0.141 | 0.138 | 0.12 | 0.14 |
| 24 | 0.160 | 0.141 | 0.139 | 0.12 | 0.13 |
| 26 | 0.161 | 0.141 | 0.139 | 0.12 | 0.13 |
| 28 | 0.162 | 0.141 | 0.141 | 0.13 | 0.13 |
| 30 | 0.163 | 0.142 | 0.142 | 0.13 | 0.13 |
| 32 | 0.164 | 0.143 | 0.143 | 0.13 | 0.13 |
| 34 | 0.164 | 0.144 | 0.144 | 0.12 | 0.12 |
| 36 | 0.164 | 0.145 | 0.145 | 0.12 | 0.12 |
| 38 | 0.164 | 0.146 | 0.146 | 0.11 | 0.11 |
| 40 | 0.163 | 0.147 | 0.146 | 0.10 | 0.10 |
| 42 | 0.163 | 0.148 | 0.147 | 0.09 | 0.09 |
| 44 | 0.161 | 0.148 | 0.148 | 0.08 | 0.08 |
| 46 | 0.159 | 0.150 | 0.148 | 0.06 | 0.07 |
| 48 | 0.158 | 0.150 | 0.148 | 0.05 | 0.07 |
| 50 | 0.156 | 0.149 | 0.148 | 0.05 | 0.05 |
| 52 | 0.154 | 0.149 | 0.148 | 0.03 | 0.04 |
| 54 | 0.153 | 0.149 | 0.148 | 0.03 | 0.04 |
| 56 | 0.152 | 0.148 | 0.148 | 0.03 | 0.03 |
| 58 | 0.149 | 0.147 | 0.147 | 0.02 | 0.02 |
| 60 | 0.148 | 0.147 | 0.146 | 0.01 | 0.01 |
| 62 | 0.146 | 0.144 | 0.145 | 0.01 | 0.01 |
| 64 | 0.144 | 0.143 | 0.144 | 0.00 | 0.00 |
| 66 | 0.140 | 0.141 | 0.142 | 0.01 | 0.01 |

TABLE 3-continued

| | | | | | |
|---|---|---|---|---|---|
| 68 | 0.138 | 0.138 | 0.140 | 0.00 | 0.02 |
| 70 | 0.135 | 0.135 | 0.137 | 0.00 | 0.02 |
| MAX | (0.164) | 0.150 | 0.148 | (0.13) | (0.25) |
| MIN | (0.114) | 0.123 | 0.120 | (0.00) | (0.00) |
| AVG | — | 0.140 | 0.130 | — | — |
| SD | — | 0.005237 | 0.009855 | — | — |

TABLE 4

COMPARATIVE EXAMPLE A

| REFLECTION | BRDF AZIMUTH Φ r_20° | | | DIFFERENCE FROM BRDF(0°) | |
|---|---|---|---|---|---|
| POLAR ANGLE | ANGLE OF INCIDENCE | ANGLE OF INCIDENCE | ANGLE OF INCIDENCE | | |
| θ r(°) | θ i_0° | θ i_30° | θ i_60° | D_30° | D_60° |
| −70 | 0.150 | 0.375 | 0.731 | 1.50 | 3.87 |
| −68 | 0.155 | 0.388 | 0.742 | 1.50 | 3.79 |
| −66 | 0.161 | 0.404 | 0.765 | 1.51 | 3.76 |
| −64 | 0.169 | 0.421 | 0.788 | 1.49 | 3.66 |
| −62 | 0.170 | 0.440 | 0.789 | 1.58 | 3.63 |
| −60 | 0.170 | 0.443 | 0.773 | 1.61 | 3.55 |
| −58 | 0.178 | 0.468 | 0.784 | 1.62 | 3.40 |
| −56 | 0.186 | 0.495 | 0.781 | 1.66 | 3.20 |
| −54 | 0.190 | 0.511 | 0.767 | 1.70 | 3.04 |
| −52 | 0.191 | 0.529 | 0.744 | 1.77 | 2.89 |
| −50 | 0.201 | 0.567 | 0.740 | 1.82 | 2.69 |
| −48 | 0.208 | 0.604 | 0.713 | 1.90 | 2.42 |
| −46 | 0.216 | 0.627 | 0.681 | 1.91 | 2.15 |
| −44 | 0.227 | 0.654 | 0.645 | 1.88 | 1.84 |
| −42 | 0.241 | 0.693 | 0.622 | 1.87 | 1.57 |
| −40 | 0.253 | 0.726 | 0.586 | 1.87 | 1.31 |
| −38 | 0.267 | 0.753 | 0.542 | 1.82 | 1.03 |
| −36 | 0.285 | 0.763 | 0.509 | 1.68 | 0.79 |
| −34 | 0.306 | 0.793 | 0.482 | 1.59 | 0.58 |
| −32 | 0.331 | 0.793 | 0.445 | 1.39 | 0.34 |
| −30 | 0.361 | 0.784 | 0.410 | 1.17 | 0.14 |
| −28 | 0.382 | 0.772 | 0.375 | 1.02 | 0.02 |
| −26 | 0.422 | 0.758 | 0.349 | 0.80 | 0.17 |
| −24 | 0.461 | 0.746 | 0.327 | 0.62 | 0.29 |
| −22 | 0.505 | 0.719 | 0.304 | 0.42 | 0.40 |
| −20 | 0.546 | 0.674 | 0.280 | 0.23 | 0.49 |
| −18 | 0.586 | 0.637 | 0.255 | 0.09 | 0.56 |
| −16 | 0.640 | 0.604 | 0.237 | 0.06 | 0.63 |
| −14 | 0.680 | 0.558 | 0.220 | 0.18 | 0.68 |
| −12 | 0.733 | 0.513 | 0.205 | 0.30 | 0.72 |
| −10 | 0.779 | 0.468 | 0.192 | 0.40 | 0.75 |
| −8 | — | 0.420 | 0.180 | — | — |
| −6 | — | 0.382 | 0.167 | — | — |
| −4 | — | 0.349 | 0.157 | — | — |
| −2 | — | 0.315 | 0.148 | — | — |
| 0 | — | 0.285 | 0.140 | — | — |
| 0 | — | 0.302 | 0.145 | — | — |

TABLE 5

| | | | | | |
|---|---|---|---|---|---|
| 2 | — | 0.276 | 0.136 | — | — |
| 4 | — | 0.250 | 0.128 | — | — |
| 6 | — | 0.227 | 0.121 | — | — |
| 8 | — | 0.210 | 0.113 | — | — |
| 10 | 0.666 | 0.191 | 0.107 | 0.71 | 0.84 |
| 12 | 0.606 | 0.175 | 0.101 | 0.71 | 0.83 |
| 14 | 0.565 | 0.164 | 0.095 | 0.71 | 0.83 |
| 16 | 0.531 | 0.153 | 0.089 | 0.71 | 0.83 |
| 18 | 0.491 | 0.144 | 0.085 | 0.71 | 0.83 |
| 20 | 0.444 | 0.138 | 0.081 | 0.69 | 0.82 |
| 22 | 0.398 | 0.131 | 0.077 | 0.67 | 0.81 |
| 24 | 0.371 | 0.123 | 0.073 | 0.67 | 0.80 |
| 26 | 0.347 | 0.117 | 0.068 | 0.66 | 0.80 |
| 28 | 0.317 | 0.113 | 0.065 | 0.64 | 0.80 |
| 30 | 0.293 | 0.108 | 0.061 | 0.63 | 0.79 |
| 32 | 0.274 | 0.105 | 0.059 | 0.62 | 0.79 |

TABLE 5-continued

| | | | | | |
|---|---|---|---|---|---|
| 34 | 0.255 | 0.101 | 0.056 | 0.60 | 0.78 |
| 36 | 0.244 | 0.096 | 0.053 | 0.61 | 0.78 |
| 38 | 0.230 | 0.094 | 0.051 | 0.59 | 0.78 |
| 40 | 0.216 | 0.092 | 0.050 | 0.57 | 0.77 |
| 42 | 0.208 | 0.087 | 0.049 | 0.58 | 0.77 |
| 44 | 0.201 | 0.085 | 0.047 | 0.58 | 0.77 |
| 46 | 0.193 | 0.083 | 0.046 | 0.57 | 0.76 |
| 48 | 0.183 | 0.081 | 0.047 | 0.56 | 0.75 |
| 50 | 0.176 | 0.077 | 0.045 | 0.56 | 0.74 |
| 52 | 0.173 | 0.075 | 0.045 | 0.57 | 0.74 |
| 54 | 0.165 | 0.073 | 0.045 | 0.56 | 0.73 |
| 56 | 0.156 | 0.071 | 0.045 | 0.55 | 0.71 |
| 58 | 0.153 | 0.068 | 0.044 | 0.55 | 0.71 |
| 60 | 0.149 | 0.065 | 0.044 | 0.56 | 0.70 |
| 62 | 0.141 | 0.064 | 0.045 | 0.55 | 0.68 |
| 64 | 0.135 | 0.062 | 0.044 | 0.54 | 0.67 |
| 66 | 0.128 | 0.059 | 0.043 | 0.54 | 0.66 |
| 68 | 0.125 | 0.056 | 0.042 | 0.55 | 0.66 |
| 70 | 0.119 | 0.054 | 0.042 | 0.54 | 0.65 |
| MAX | (0.779) | 0.793 | 0.789 | (1.91) | (3.87) |
| MIN | (0.119) | 0.054 | 0.042 | (0.06) | (0.02) |
| AVG | — | 0.34 | 0.28 | — | — |
| SD | — | 0.252327 | 0.269342 | — | — |

In the case where the isotropy of the back-scattering is high, the color of the optical filter does not change much in accordance with the angle at which the optical filter is viewed. In other words, the optical filter exhibits a desired color regardless of the shape thereof. High isotropy of the back-scattering characteristic of visible light indicates high isotropy of transmittance characteristics of infrared rays. Therefore, an optical filter according to an embodiment of the present invention may have desired infrared transmittance characteristics even if being processed to have any of various three-dimensional shapes. Needless to say, the three-dimensional shape of the optical filter may be designed appropriately in accordance with the shape or the relative position of the infrared receiving surface.

An optical filter according to an embodiment of the present invention is usable for any of various uses in addition to a sensing device (e.g., infrared camera) described above as an example or a communication device, and is preferably usable for, for example, a solar cell, a heater using infrared rays or an optical power supply device using infrared rays.

INDUSTRIAL APPLICABILITY

An optical filter according to an embodiment of the present invention is usable as an infrared-transmissive filter usable for, for example, sensor technologies, communication technologies and the like.

REFERENCE SIGNS LIST

10, 10A, 20A optical filter
12 matrix
14 fine particles

The invention claimed is:
1. An optical filter having back-scattering characteristics, wherein the optical filter has a linear transmittance of 60% or higher for light having a wavelength in at least a part of a wavelength range not shorter than 760 nm and not longer than 2000 nm, and
wherein:
in a case where an incident light has a polar angle of 0° in a direction of incidence, a bidirectional reflectance distribution function value in a direction having an azimuth of 20° from a plane of incidence and having a polar angle of −60° is BRDF (0°; 20°, −60°), in a case where the incident light has a polar angle of 30° in the direction of incidence, the bidirectional reflectance distribution function value in the direction having an azimuth of 20° from the plane of incidence and having a polar angle of −60° is BRDF (30°; 20°, −60°), and in a case where the incident light has a polar angle of 60° in the direction of incidence, the bidirectional reflectance distribution function value in the direction having an azimuth of 20° from the plane of incidence and having a polar angle of −60° is BRDF (60°; 20°, −60°), in a case where the incident light has a wavelength in at least a part of a visible light wavelength range, |BRDF (0°; 20°, −60°)−BRDF (30°; 20°, −60°)|/BRDF (0°; 20°, −60°) is 1.0 or smaller, and |BRDF (0°; 20°, −60°)−BRDF (60°; 20°, −60°)|/BRDF (0°; 20°, −60°) is 1.0 or smaller, and wherein a transmittance curve of the filter in a visible light wavelength region includes a curved portion where the linear transmittance is decreased monotonously from a longer wavelength to a shorter wavelength side, and the curved portion is shifted toward the longer wavelength as an angle of incidence is increased.

2. The optical filter of claim 1, wherein |BRDF (0°; 20°, −60°)−BRDF (30°; 20°, −60°)|/BRDF (0°; 20°, −60°) is 0.50 or smaller, and |BRDF (0°; 20°, −60°) −BRDF (60°; 20°, −60°)|/BRDF (0°; 20°, −60°) is 0.50 or smaller.

3. The optical filter of claim 1, wherein |BRDF (0°; 20°, −60°) −BRDF (30°; 20°, −60°)|/BRDF (0°; 20°, −60°) is 0.25 or smaller, and |BRDF (0°; 20°, −60°) −BRDF (60°; 20°, −60°)|/BRDF (0°; 20°, −60°) is 0.25 or smaller.

4. The optical filter of claim 1, wherein the optical filter has a value of L* measured by a Specular Component Exclude method of 20 or larger.

5. The optical filter of claim 1, wherein the optical filter includes a substrate and a film formed on the substrate, wherein the linear transmittance of the film for light having a wavelength in at least a part of the wavelength range not shorter than 760 nm and not longer than 2000 nm is 60% or higher wherein with settings that.

6. The optical filter of claim 1, wherein the linear transmittance for light having a wavelength of 950 nm is 60% or higher, or the linear transmittance for light having a wavelength of 1550 nm is 60% or higher.

7. The optical filter of claim 1, wherein a color exhibited in the case where standard light from a D65 light source, which is a light source emitting light according to the standard of the International Commission on Illumination, is used has x and y coordinates in ranges of 0.25≤x≤0.40 and 0.25≤y≤0.40 on a CIE 1931 chromaticity diagram, wherein the CIE 1931 chromaticity diagram is the chromaticity diagram promulgated by the International Commission on Illumination.

8. The optical filter of claim 1, wherein for an angle of incidence of 60%, the linear transmittance for light having a wavelength of 950 nm is 80% or higher of the linear transmittance for an when the angle of incidence of 0°.

9. The optical filter of claim 1, wherein the optical filter comprises a matrix and fine particles dispersed in the matrix.

10. The optical filter of claim 9, wherein the fine particles include mono-dispersed first fine particles having an average particle diameter in a range not shorter than 80 nm and not longer than 300 nm.

11. The optical filter of claim 10, wherein the first fine particles have an average particle diameter of 150 nm or longer.

12. The optical filter of claim 9, wherein the fine particles have an average value of inter-gravitational center distances of 200 nm or longer on a cross-section vertical to a planar direction of the filter.

13. The optical filter of claim 9, wherein the fine particles have a coefficient of variation, of an average value of inter-gravitational center distances on a cross- section vertical to a planar direction of the filter, of 10% or higher, or of 45% or lower.

14. The optical filter of claim 9, wherein the fine particles form at least a colloidal amorphous array.

15. The optical filter of claim 9, wherein the fine particles has a volume fraction not lower than 6% and not higher than 60%.

16. The optical filter of claim 9, wherein where the matrix has a refractive index of $n_M$ and the fine particles have a refractive index of $n_p$, both for light having a wavelength of 546 nm, $|n_M-n_p|$ is not smaller than 0.03 and not larger than 0.6.

17. The optical filter of claim 16, wherein the matrix is formed of a resin, and the fine particles are formed of an inorganic material.

18. A method for producing the optical filter of claim 17, the method comprising:
preparing a curable resin composition containing the fine particles dispersed and mixed in a curable resin;
providing a surface of a substrate with the curable resin composition, and
curing the curable resin contained in the curable resin composition provided on the surface. device.

19. An optical module, comprising:
a device including an infrared receiver; and
the optical filter of claim 1 located on a front surface of the infrared receiver of the device.

20. The optical module of claim 19, wherein the device is a sensing device, a communication device, a solar cell, a heater or a power supply device.

* * * * *

UNITED STATES PATENT AND TRADEMARK OFFICE
CERTIFICATE OF CORRECTION

| | |
|---|---|
| PATENT NO. | : 11,914,180 B2 |
| APPLICATION NO. | : 17/911875 |
| DATED | : February 27, 2024 |
| INVENTOR(S) | : Y. Numata et al. |

It is certified that error appears in the above-identified patent and that said Letters Patent is hereby corrected as shown below:

On the Title Page

Item [57], Line 2, change "avelengths in" to -- wavelengths in --
Item [57], Line 7, change "'here the" to -- where the --

In the Claims

Column 29, Line 36 Claim 4, change "of $L^*$" to -- of the degree of whiteness $L^*$ --
Column 29, Lines 43-44 Claim 5, change "higher wherein with settings that." to -- higher. --
Column 30, Line 7 Claim 8, change "an when the angle" to -- an angle --
Column 30, Line 46 Claim 18, change "surface. device." to -- surface. --

Signed and Sealed this
Twenty-fifth Day of June, 2024

Katherine Kelly Vidal
*Director of the United States Patent and Trademark Office*